United States Patent [19]

Sugiyama et al.

[11] Patent Number: 5,038,251
[45] Date of Patent: Aug. 6, 1991

[54] ELECTRONIC APPARATUS AND A METHOD FOR MANUFACTURING THE SAME

[75] Inventors: Yoshinobu Sugiyama; Shohei Sawada; Takashi Hinooka; Kaoru Yoshida, all of Tokyo, Japan

[73] Assignee: Casio Computer Co., Ltd., Tokyo, Japan

[21] Appl. No.: 178,236

[22] Filed: Apr. 6, 1988

[30] Foreign Application Priority Data

| Apr. 8, 1987 | [JP] | Japan | 62-86572 |
| Aug. 7, 1987 | [JP] | Japan | 62-197803 |
| Aug. 7, 1987 | [JP] | Japan | 62-197804 |
| Oct. 8, 1987 | [JP] | Japan | 62-252361 |
| Oct. 30, 1987 | [JP] | Japan | 62-274930 |
| Oct. 30, 1987 | [JP] | Japan | 62-274932 |
| Oct. 31, 1987 | [JP] | Japan | 62-276439 |
| Jan. 9, 1988 | [JP] | Japan | 63-2907 |

[51] Int. Cl.⁵ .............................. H05K 1/00
[52] U.S. Cl. .................... 361/398; 200/292; 235/488; 361/404; 361/409; 364/712; 364/708
[58] Field of Search ............. 361/380, 397, 398, 399, 361/400, 401, 403, 404, 409, 421; 29/832, 837, 845, 846; 439/68, 69, 876, 886; 174/250, 253, 254, 255, 260, 261, 265, 268; 200/5 A, 292, 306, 512, 515; 235/380, 488, 492

[56] References Cited

U.S. PATENT DOCUMENTS

| 4,096,577 | 6/1978 | Ferber et al. | 174/254 |
| 4,104,728 | 8/1978 | Kasubuchi | 364/712 |
| 4,113,981 | 9/1978 | Fujita et al. | 174/88 R |
| 4,714,980 | 12/1987 | Hara | 361/395 |
| 4,749,875 | 6/1988 | Hara | 364/708 |

FOREIGN PATENT DOCUMENTS 1522408 8/1978 United Kingdom .
2076223 11/1981 United Kingdom .

Primary Examiner—Leo P. Picard
Assistant Examiner—Donald A. Sparks
Attorney, Agent, or Firm—Frishauf, Holtz, Goodman & Woodward

[57] ABSTRACT

A thin electronic calculator having a circuit board unit in which an IC pellet is directly mounted on a film board and allowing easy mass-production is provided. Metal foil leads each having one end and the other end radially extending from the one end and having a larger width than the one end are formed on the film board. The IC pellet is bonded to one end portions of the metal foil leads through bump electrodes. The circuit board unit is fixed to a wiring board by an anisotropically electrical conductive adhesive. The other end of each metal foil lead is electrically connected to a corresponding connecting terminal formed on the wiring board. An electronic component assembly constituted by the circuit board unit and the wiring board is received in upper and lower covers, and is adhered by adhesive islands deposited on the covers.

28 Claims, 23 Drawing Sheets

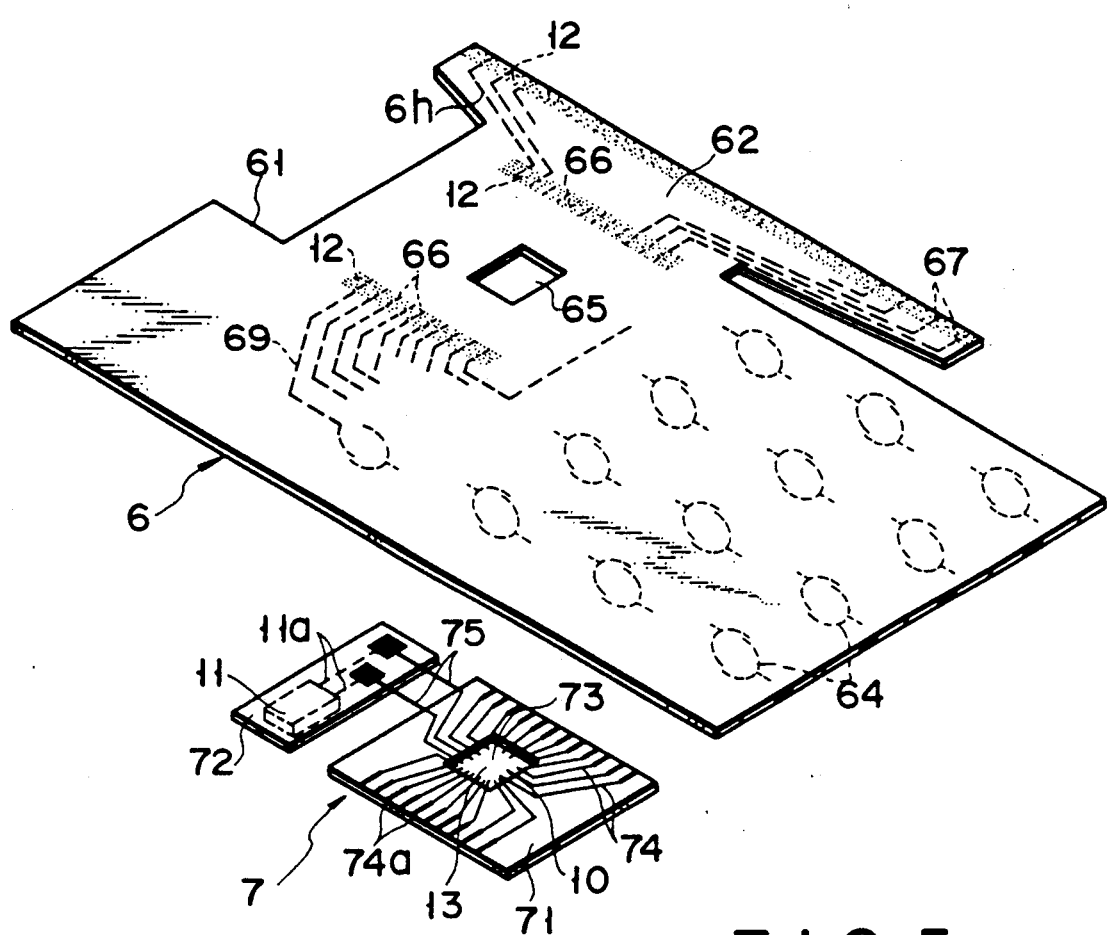
F I G. 5
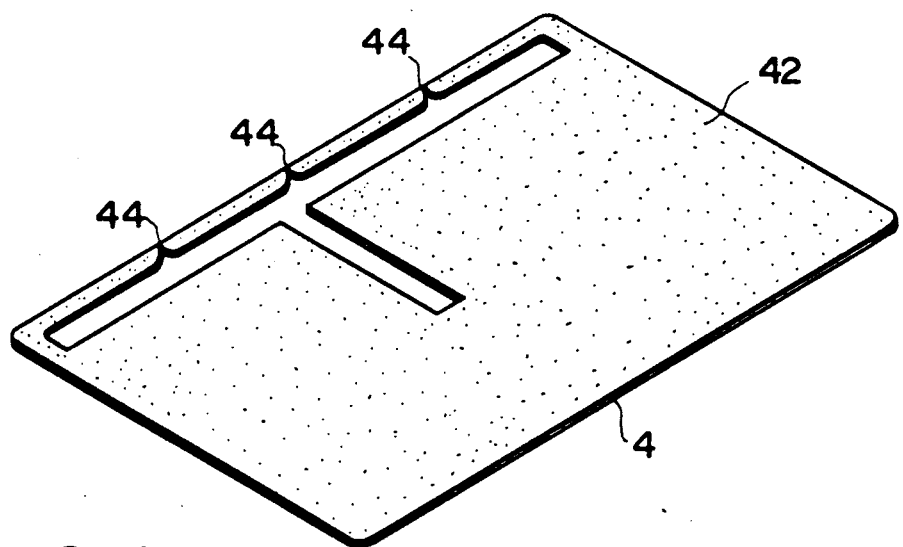
F I G. 6

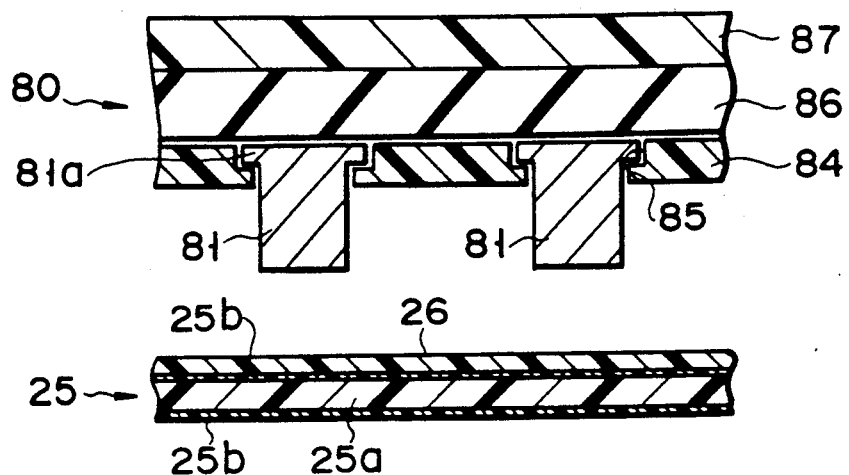
F I G. 18A
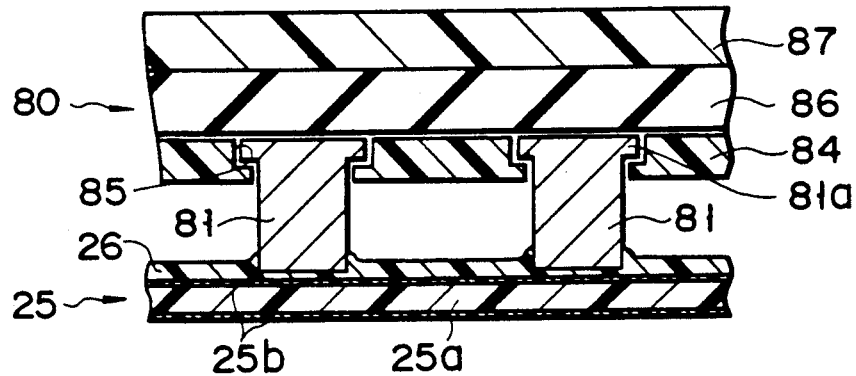
F I G. 18B
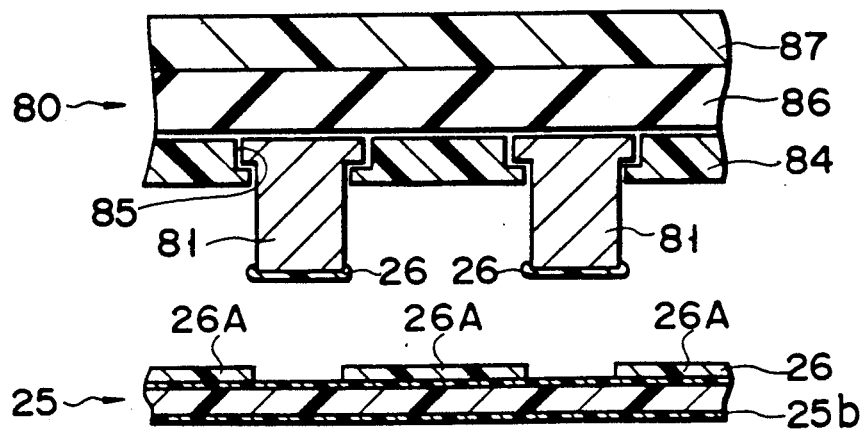
F I G. 18C

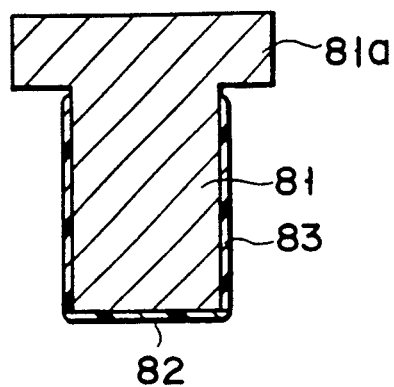
F I G. 19
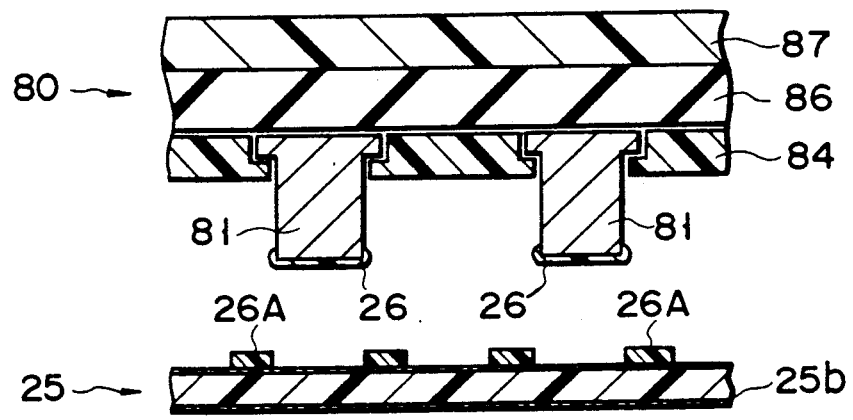
F I G. 20
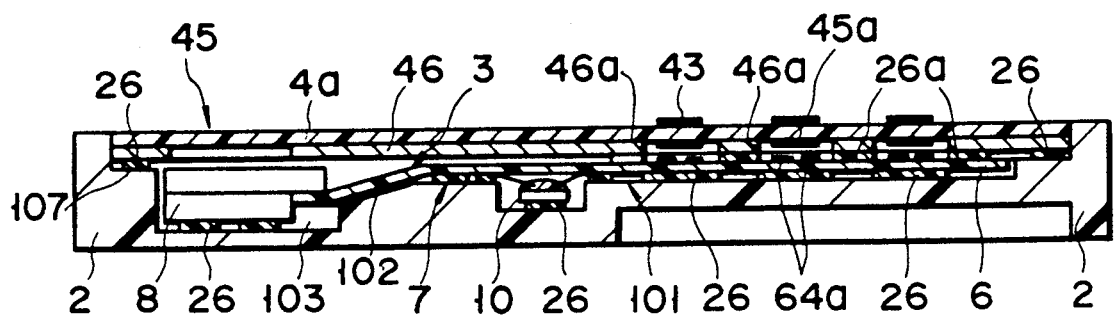
F I G. 21

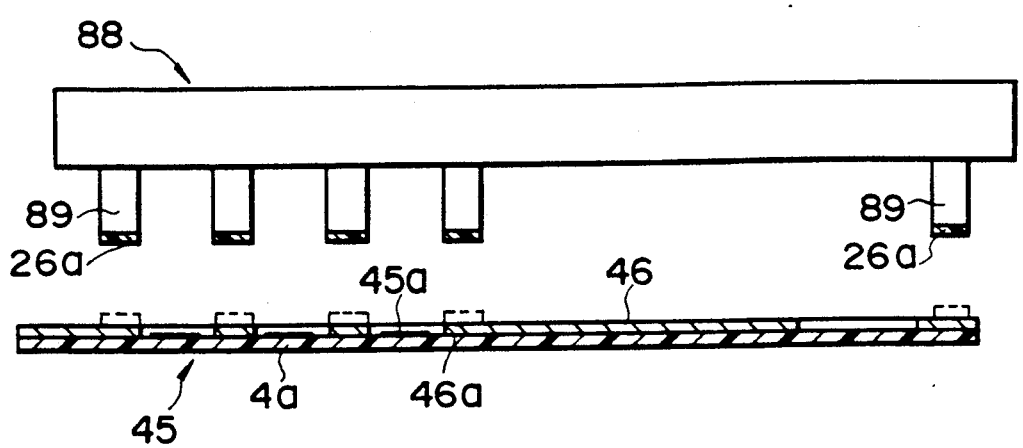
F I G. 22A
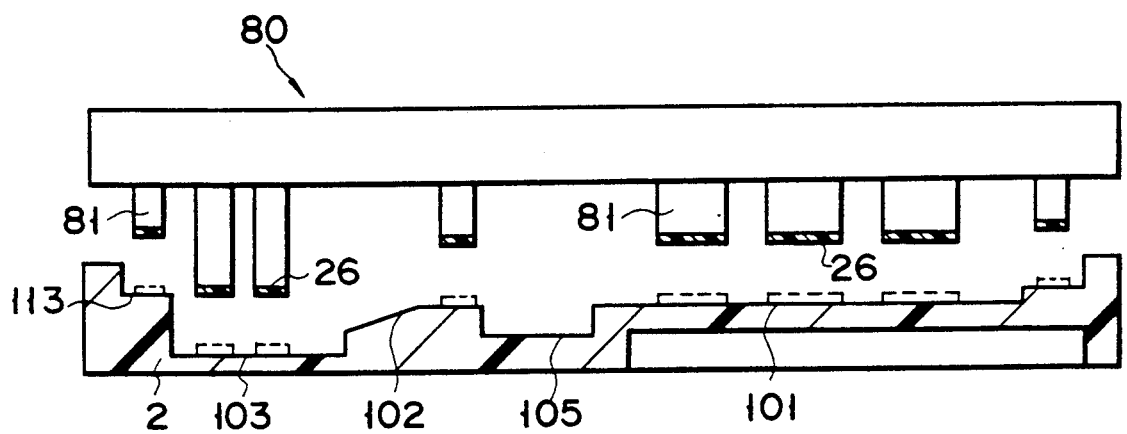
F I G. 22B
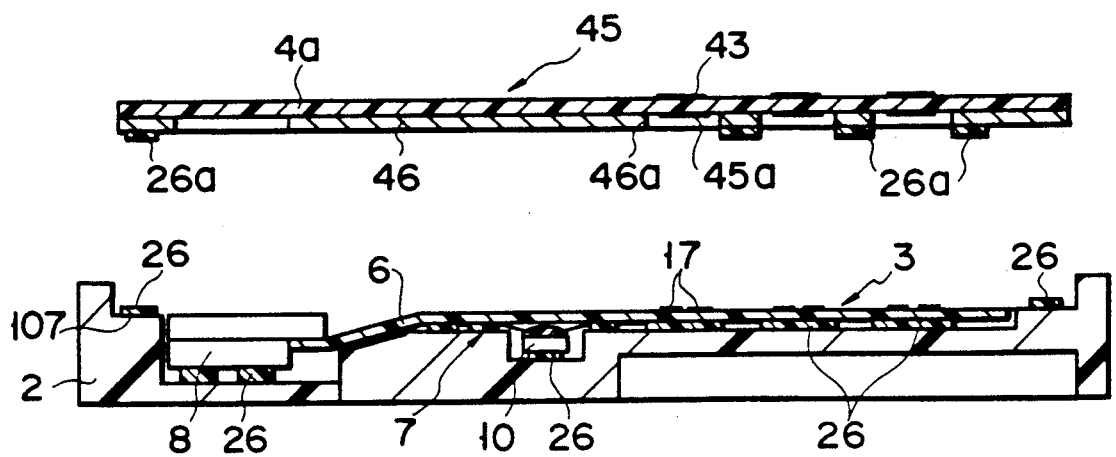
F I G. 22C

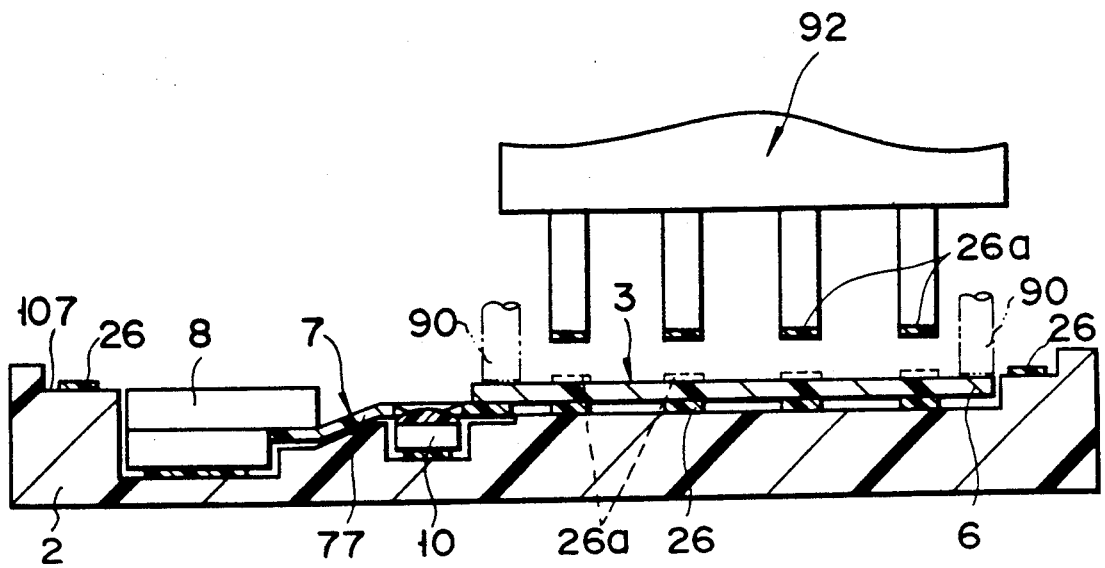
F I G. 25B
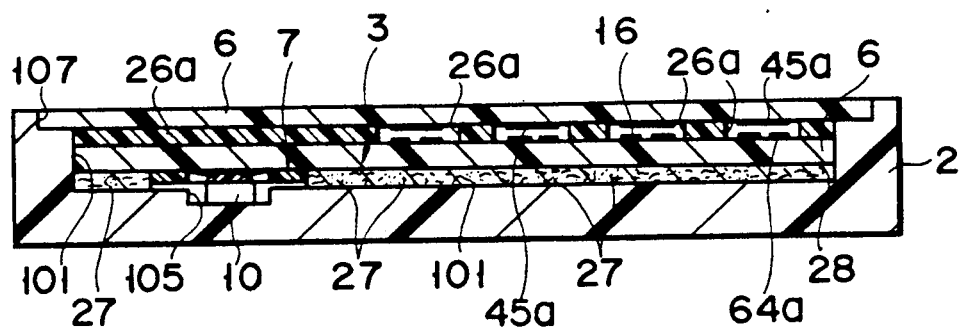
F I G. 26

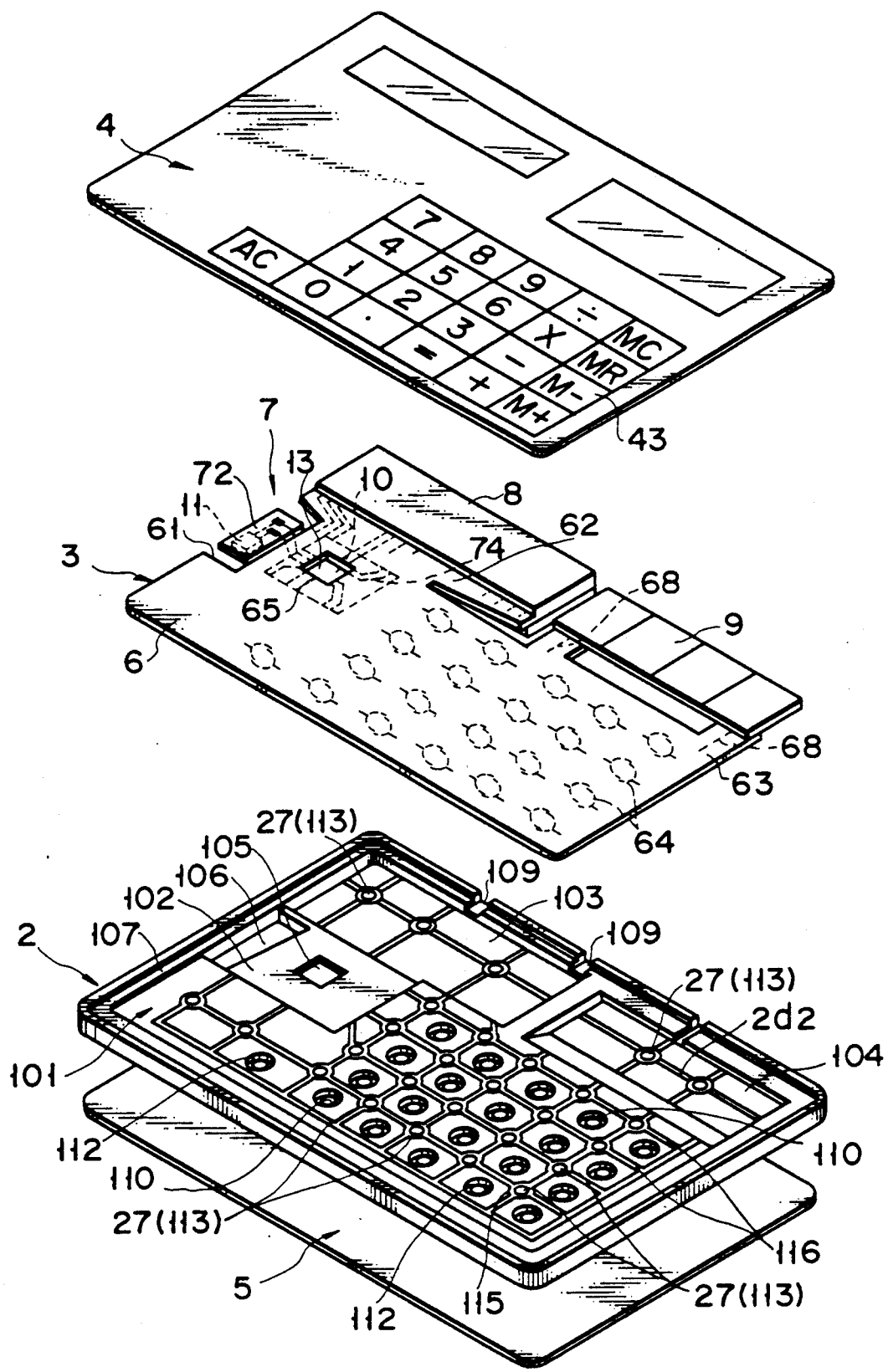
F I G. 28

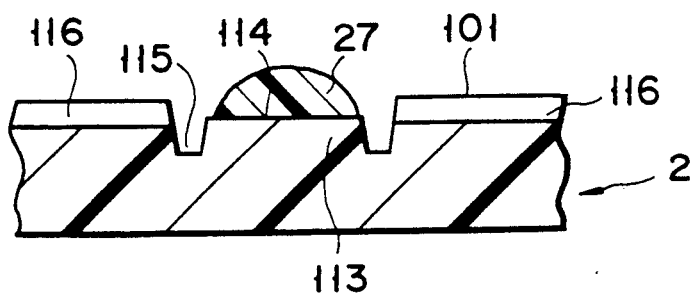
F I G. 30A
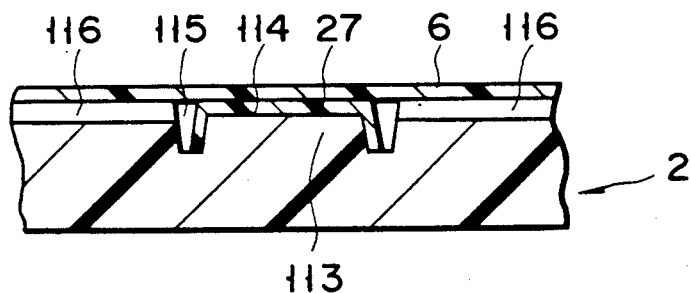
F I G. 30B
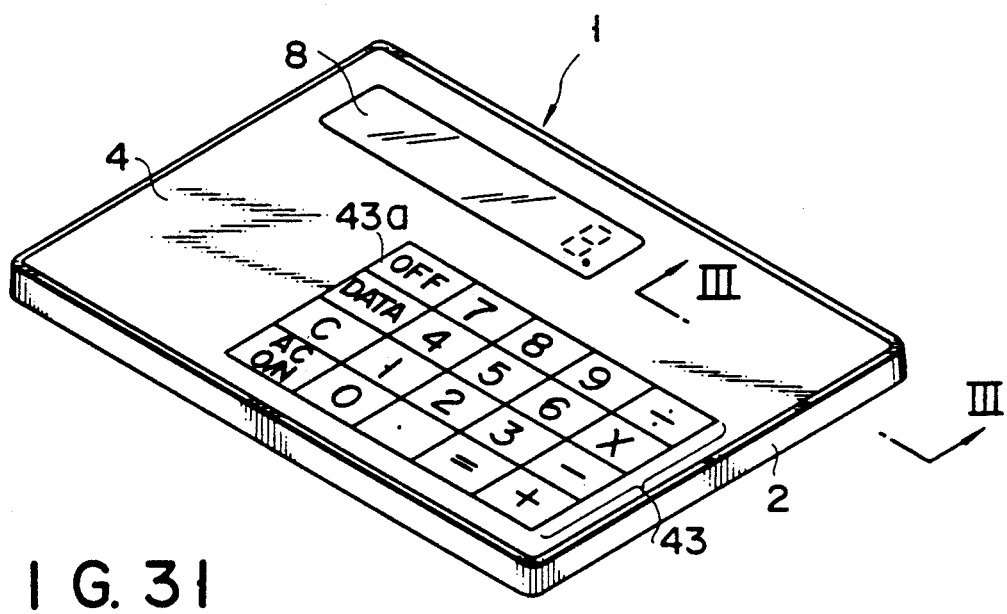
F I G. 31

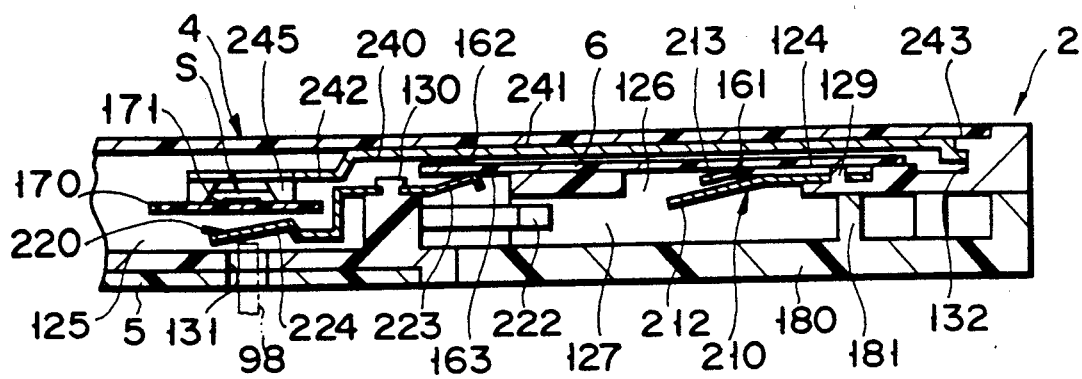
F I G. 34
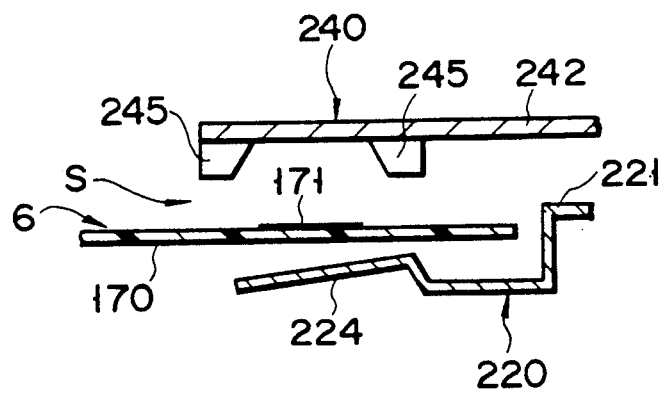
F I G. 35A
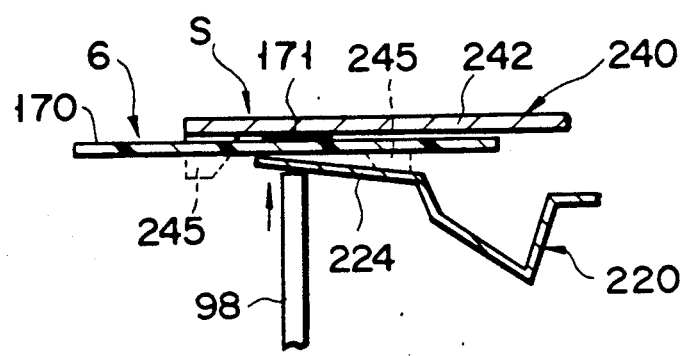
F I G. 35B

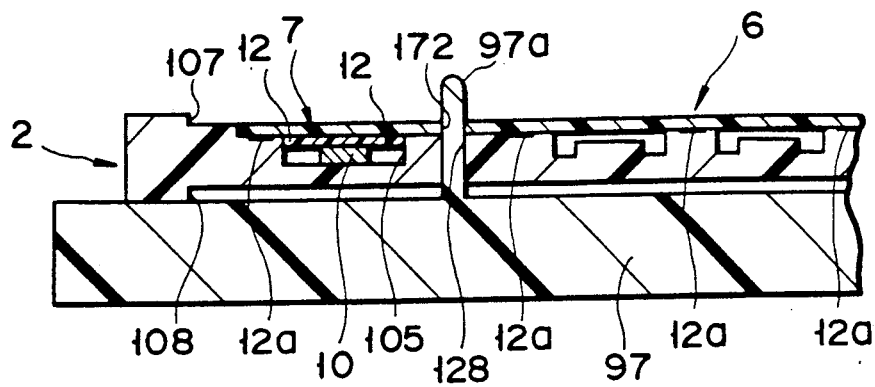
F I G. 36
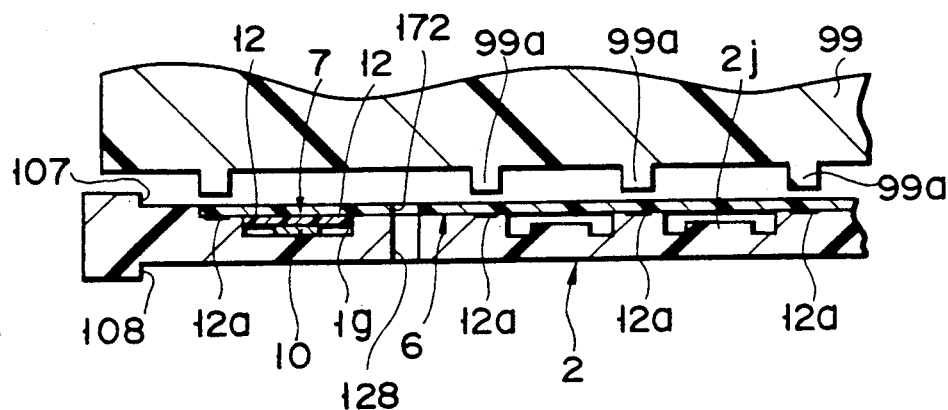
F I G. 37
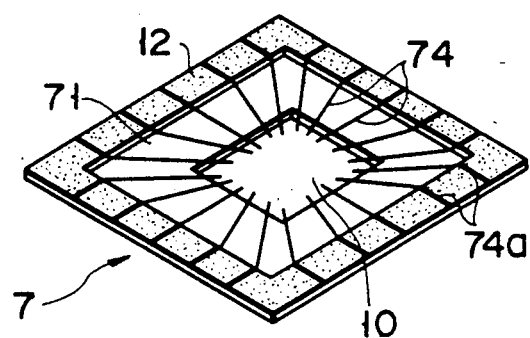
F I G. 38

ELECTRONIC APPARATUS AND A METHOD FOR MANUFACTURING THE SAME

BACKGROUND OF THE INVENTION

1. Field of the Invention

The present invention relates to a compact electronic apparatus such as an electronic calculator and a method for manufacturing the same.

2. Description of the Related Art

Recently, the prices of compact electronic calculators are decreasing since an arithmetic circuit, a display driver, circuit and a CPU can be formed on one chip. Therefore, in order to further reduce cost, IC pellets must be directly bonded to wiring boards (wireless bonding). Note that the "IC pellet" means an individual chip diced from a wafer, and is distinguished from an IC chip having external connection leads bonded by wire leads. U.S. Pat. No. 4,104,728 discloses such a technique. An IC chip in this specification has the same meaning as the IC pellet of this invention, and will be referred to as an IC pellet hereinafter.

More specifically, U.S. Pat. No. 4,104,728 discloses a technique for face-down bonding IC pellet 144 to wiring patterns 30 formed on flexible substrate 14 in FIG. 6 of this patent. In this case, electrodes of IC pellet 144 have a small pitch and a small width. Therefore, wiring patterns 30 require high-precision etching. However, wiring patterns 30 have a large area, since they have key contact patterns 142. For this reason, high-precision etching of the entire wiring patterns results in economical demerit and low yield. Furthermore, positioning between the electrodes of the IC pellet and wiring patterns 30 is difficult, and many defective products are manufactured. As a more important problem, as shown in FIG. 6 of this USP, since wiring patterns 30 are downward inclined toward substrate 14 by face down bonding, an edge portion of IC pellet 144 is brought into contact with the inclined portions of wiring patterns 30, and there is a high possibility of short-circuiting an internal circuit of the IC pellet. FIGS. 7 to 11 of the above USP show embodiments for eliminating the economical demerit caused by the large area of wiring patterns 30. In these embodiments, after an IC pellet is bonded to wiring patterns formed on a daughter board having a small area, the wiring patterns on the daughter board are bonded to a mother pattern. However, since this bonding is achieved by a solder or a conductive adhesive, it must be performed without short-circuiting adjacent wiring patterns, resulting in inefficiency. U.S. Pat. No. 4,113,981 discloses a bonding technique using an anisotropically electrical conductive adhesive (FIG. 7). Since the anisotropically electrical conductive adhesive has conductivity along only its thickness direction, there is a low possibility of short-circuiting adjacent wiring patterns, resulting in convenience. However, an IC chip disclosed in this patent requires higher cost than an IC pellet described in this invention. Furthermore, since a gap is formed between leads of an IC chip, the leads of the IC chip cannot be easily bonded by the anisotropically electrical conductive adhesive, and a sufficient bonding strength cannot be obtained. An IC pellet may be directly face-down bonded to wiring patterns. However, since the electrodes of the IC pellet have a very small pitch and width, if no conductive particles contained in the adhesive are interposed between an electrode and a corresponding wiring pattern, the wiring patterns may not be conducted. If the conductive particles gather between specific adjacent wiring patterns, these adjacent wiring patterns may be short-circuited. For these reasons, mass-production of the apparatus is prevented.

SUMMARY OF THE INVENTION

It is therefore an object of the present invention to provide a compact electronic apparatus which has a wiring substrate on which an IC pellet is bonded, and has improved reliability and mass-production property.

According to the present invention, there is provided an electronic apparatus in which a wiring board connected to electrodes of an IC pellet is arranged in an electronic component receiving portion formed by upper and lower covers, comprising:

film board means in which an opening larger than dimensions of the IC pellet is formed;

a plurality of metal foil leads fixed on an upper surface of said film board means and each having one end extending inside said opening and located at a level lower than the upper surface of said film board means and the other end extending toward an outer peripheral portion of said film board means and formed to have a width larger than that of the one end, the pitch of the other ends being larger than that of the one ends;

bump electrodes, interposed between said electrodes of the IC pellet and said metal foil leads, for electrically connecting said electrodes and said metal foil leads, respectively;

a plurality of connecting terminals provided to said wiring board to oppose the other ends of said metal foil leads; and an anisotropically electrical conductive adhesive interposed between said film board means and said wiring board to electrically connect the other ends of said metal foil leads and said connecting terminals of said wiring board and to bond said film board means to said wiring board.

BRIEF DESCRIPTION OF THE DRAWINGS

These and other objects and features of the present invention can be understood by reference to the accompanying drawings, in which:

FIGS. 1 to 13 show a first embodiment in which the present invention is applied to a card-like electronic calculator, in which FIG. 1 is a perspective view of the card-like electronic calculator, FIG. 2 is an exploded perspective view of the calculator shown in FIG. 1, FIG. 3 is an enlarged sectional view taken along a line I—I in FIG. 1, FIG. 4 is an enlarged sectional view taken along a line II—II in FIG. 1, FIG. 5 is an exploded perspective view of the main part of an electronic component assembly shown in FIG. 2, FIG. 6 is a perspective view of an upper sheet shown in FIG. 2 when viewed from a rear surface, FIG. 9 is an enlarged cross-sectional view showing a method of bonding the circuit board unit shown in FIG. 5 to a wiring board, FIG. 10 is an enlarged view of the main part, FIG. 11 is a view for explaining processes in an automatic assembly line for manufacturing the card-like electronic calculator shown in FIG. 1, FIG. 12 is a sectional view for explaining a method for transferring carbon to a cover shown in FIG. 2, and FIG. 13 is a sectional view for explaining a method for transferring an adhesive to the cover shown in FIG. 2;

FIGS. 14 to 16 show a method of bonding an electronic component assembly to a cover according to a second embodiment of the present invention, in which FIG. 14 is a sectional view showing a state wherein an adhesive is transferred to a cover, FIG. 15 is a sectional view showing a state after the adhesive was transferred to the cover, and FIG. 16 is a sectional view of an adhesive transfer sheet shown in FIG. 14;

FIGS. 18A to 18F are sectional views for explaining processes of transferring an adhesive to a cover;

FIG. 19 is a sectional view showing a structure of a transfer pin;

FIG. 20 is a view for explaining a method of temporarily transferring an adhesive to a transfer head;

FIGS. 21 to 23 show a fourth embodiment of a card-like electronic calculator, in which FIG. 21 is a cross-sectional view of the card-like electronic calculator, FIGS. 22A to 22C are views for explaining a method for manufacturing the card-like electronic calculator shown in FIG. 21, and FIG. 23 is a view for explaining a method for manufacturing the card-like electronic calculator shown in FIG. 21;

FIGS. 24 to 25B show a fifth embodiment of the card-like electronic calculator, in which FIG. 24 is a cross-sectional view of the card-like electronic calculator, and FIGS. 25A and 25B are sectional views for explaining a method for manufacturing the card-like electronic calculator shown in FIG. 24;

FIGS. 26 to 27C show a sixth embodiment of a card-like electronic calculator, in which FIG. 26 is a cross-sectional view of the card-like electronic calculator, and FIGS. 27A to 27C are sectional views for explaining a method for manufacturing the card-like electronic calculator shown in FIG. 26;

FIG. 28 to 30B show a seventh embodiment of a card-like electronic calculator, in which FIG. 28 is an exploded perspective view of the card-like electronic calculator, FIG. 29 is a view for explaining processes in an automatic assembly line for manufacturing the card-like electronic calculator shown in FIG. 28, and FIGS. 30A and 30B are views for explaining a method of bonding a wiring board to a cover shown in FIG. 28; and FIGS. 31 to 38 show an eighth embodiment of a card-like electronic calculator, in which FIG. 31 is a perspective view of the card-like electronic calculator, FIG. 32 is an exploded perspective view of the electronic calculator shown in FIG. 31, FIG. 33 is an exploded perspective view of a battery receiving portion of the electronic calculator shown in FIG. 31, FIG. 34 is a cross-sectional view of the electronic calculator taken along a line III—III in FIG. 31, FIGS. 35A and 35B are view for explaining an ON-/OFF mechanism of a reset switch shown in FIG. 33, FIG. 36 is a sectional view showing a state wherein the electronic calculator shown in FIG. 31 is attached to a positioning jig, FIG. 37 is a sectional view showing a state wherein a wiring board of the electronic calculator shown in FIG. 31 is adhered to a lower cover, and FIGS. 38 is a view showing another embodiment of a circuit board unit shown in FIG. 32

DETAILED DESCRIPTION OF THE PREFERRED EMBODIMENTS

A first embodiment in which the present invention is applied to a thin electronic calculator will be described with reference to FIGS. 1 to 3.

Figure 1:
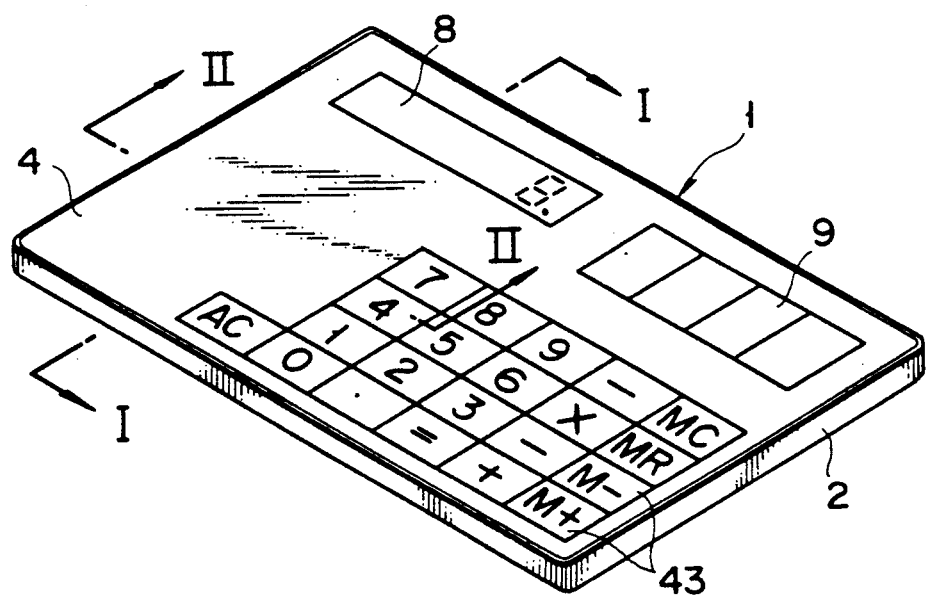
Figure 2:
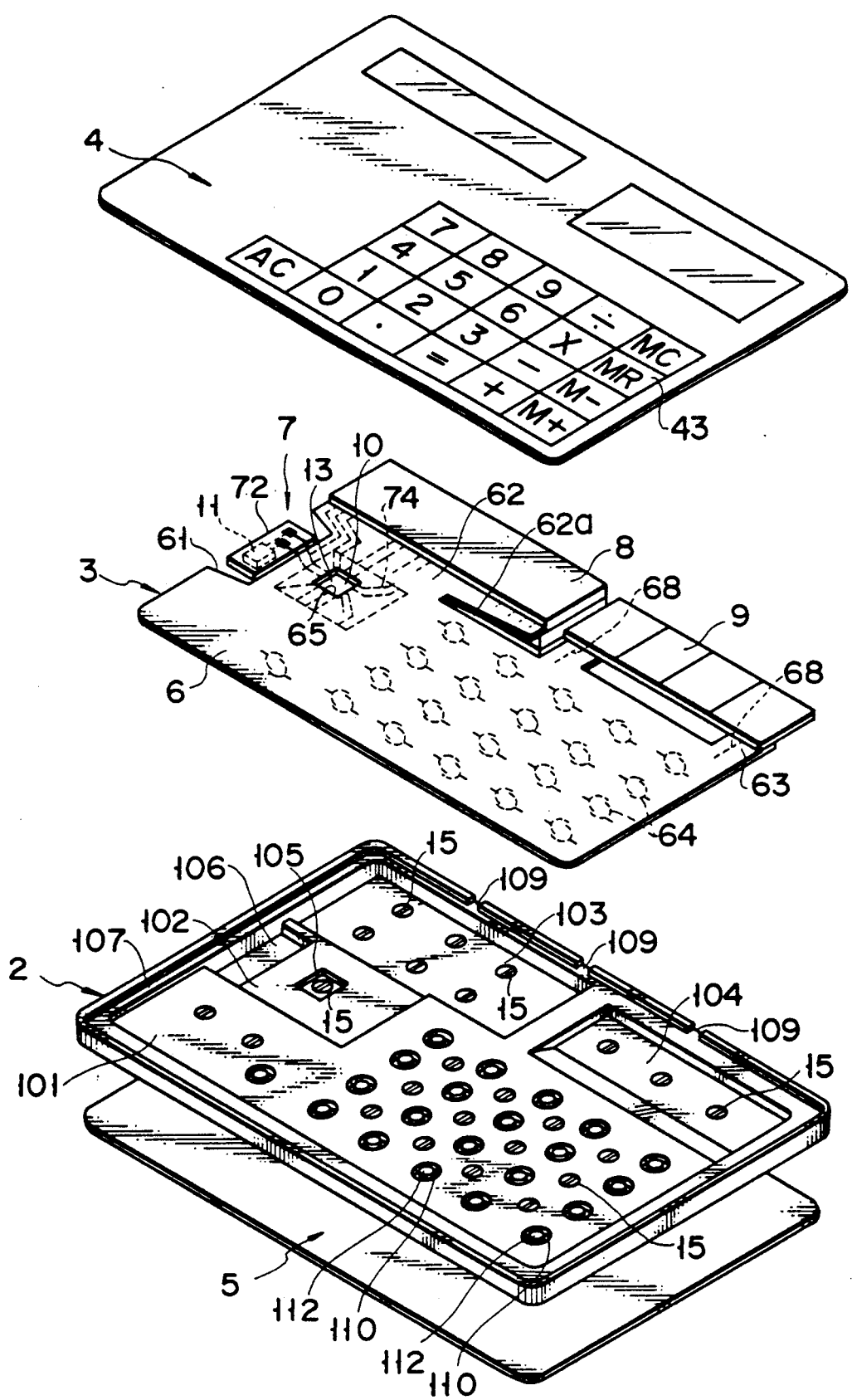
Figure 3:
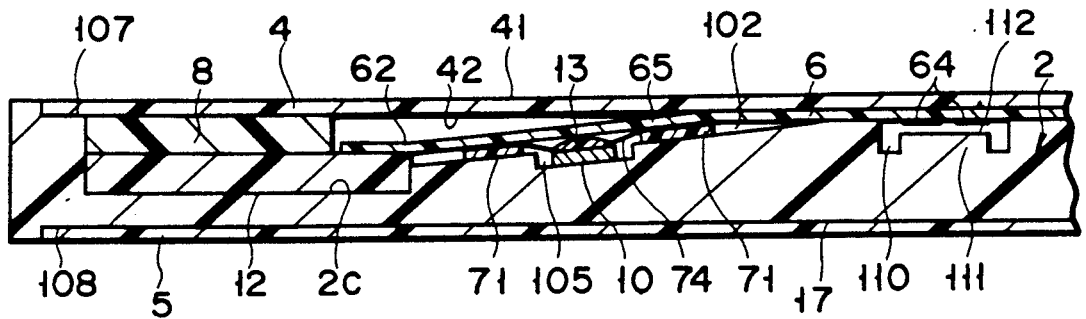

Referring to FIGS. 1 to 3, thin electronic calculator 1 is formed to have a visiting card type area (85.5 mm × 54 mm), as shown in FIG. 1, and a thickness of about 2 to 3 mm, and is slightly larger than that of a visiting card. FIG. 2 shows the structure of electronic calculator 1. Calculator 1 is constituted by electronic component assembly 3 which is adhered and housed inside lower cover 2, upper sheet 4 adhered to the upper surface of lower cover 2, and lower sheet 5 adhered to the lower surface of lower cover 2.

Electronic component assembly 3 comprises wiring board 6, circuit board unit 7, liquid crystal display (LCD) panel 8, solar cell 9, and the like. Wiring board 6 has a structure in which a conductive material pattern is formed on the lower surface of a flexible film such as polyester. Notch 61 is formed in one side portion (left portion in FIG. 2) of wiring board 6 to partially store circuit board unit 7. Connecting portions 62 and 63 for LCD panel 8 and solar cell 9 are formed on the upper side portion of board 6. Notch 62a is formed in connecting portion 62 for connecting LCD panel 8 so as to provide flexibility. Connecting portion 63 for connecting solar cell 9 extends toward the two side end portions of solar cell 9. A wiring pattern formed on the lower surface of wiring board 6 is constituted by split movable contacts 64, connecting terminals 66 for circuit board unit 7, connecting terminals 67 for LCD panel 8, connecting terminals 68 (FIG. 2) for solar cell 9, wirings 69 for connecting these terminals, and the like, as shown in FIG. 5. Movable contacts 64 are arranged in a matrix on the lower surface of wiring board 6. Connecting terminals 66 are arranged on a portion on which circuit board unit 7 is mounted. Connecting terminals 67 are arranged on connecting portion 62 for LCD panel 8. Hot-melt anisotropically electrical conductive adhesive 12 is printed on connecting terminals 66 and 67 on the lower surface of wiring board 6.

Circuit board unit 7 is constituted by first film board 71 on which IC pellet 10 is mounted, and second film board 72 on which capacitor 11 is mounted, as shown in FIG. 5. These boards are connected through metal foil leads 75. Film board 71 or 72 is formed of a plastic film such as an epoxy resin film contained glass fiber, bismaleimide triazine film, polyimide, or the like. First film board 71 is attached to the lower surface of wiring board 6, and second film board 72 is fitted in notch 61 of wiring board 6. More specifically, film board 71 is formed into a rectangular shape, and has central square hole 73. IC pellet 10 is arranged in square hole 73. Metal foil leads 74 of a copper foil are provided on the upper surface of film board 71. Each metal foil lead 74 has one end extending into central square hole 73. As shown in FIG. 3, one end of each metal foil lead 74 is inclined downward from the upper surface of first film board 71 into central square hole 73, and IC pellet 10 is bonded to the distal end of the inclined portion. The bonding portion is covered with synthetic resin 13. Each metal foil lead 74 has the other end 74a extending toward the outer periphery of film board 71. In this case, metal foil leads 74 radially extend from the one end side connected to IC pellet 10 to have a larger pitch in the width direction between adjacent foils at the other end side. Thus, a problem of short-circuiting adjacent leads 74 can be avoided. Outer end 74a of each metal foil lead 74 has a larger width than the one end portion. Two metal foil leads 75 of metal foil leads 74 extend toward second film board 72. The other ends 74a of remaining metal foil leads 74 are connected to connecting terminals 66 of wiring board 6 by anisotropically electrical conductive adhesive 12. Capacitor 11 is attached to the rear surface of second film board 72. Leads 11a of capacitor 11 are soldered to two metal foil leads 75 of first film board 71. Note that capacitor 11 is provided to stabilize power supply of solar cell 9. Square hole 65 is formed in wiring board 6 to have substantially the same size as square hole 73.

LCD panel 8 is an element for displaying input data and an arithmetic operation result, and is connected to connecting terminals 67 arranged on connecting portion 62 of wiring board 6 by adhesive 12. Solar cell 9 serves as a power supply of the overall apparatus, and is connected to connecting terminals 68 provided to connecting portion 63 of wiring board 6 by adhesive 12.

Lower cover 2 is provided to store electronic component assembly 3, and is formed of a hard synthetic resin. Board receiving portion 101, unit receiving portion 102, panel receiving portion 103, and battery receiving portion 104 are formed in lower cover 2. A shallow board receiving portion 101 is formed to receive wiring board 6 on lower cover 2. Recesses 110 are formed at portions corresponding to movable contacts 64 of wiring board 6 in receiving portion 101, and pressure-sensitive hot-melt adhesive 15 is deposited on the remaining portion to form dot-like adhesive islands. Adhesive 15 is of a hot-melt type which is melted by heating, and is of a cold gluing type which has adhesion at room temperature upon being heated once. Columnar projection 111 is formed in each recess 110 of lower cover 2, as shown in FIG. 3, and fixed contact 112 formed of carbon or the like is formed on the upper surface of projection 111 to face corresponding movable contact 64. Unit receiving portion 102 is formed to receive circuit board unit 7, and has an inclined surface which is gradually inclined downward from board receiving portion 101 toward panel receiving portion 103, as shown in FIG. 3. Wiring board 6 on which circuit board unit 7 is mounted is urged toward the inclined surface, and is fixed thereto. Since film boards 71 and 72 are gradually deformed by the inclined surface, spring back which inevitably occurs in a normal bending method can be prevented. Recess 105 is formed at the center of unit receiving portion 102, and opening 106 is formed at the left side of recess 105. Recess 105 is formed to store IC pellet 10, and above-mentioned pressure-sensitive hot-melt adhesive 15 is deposited on the bottom surface of recess 105.

Figure 4:
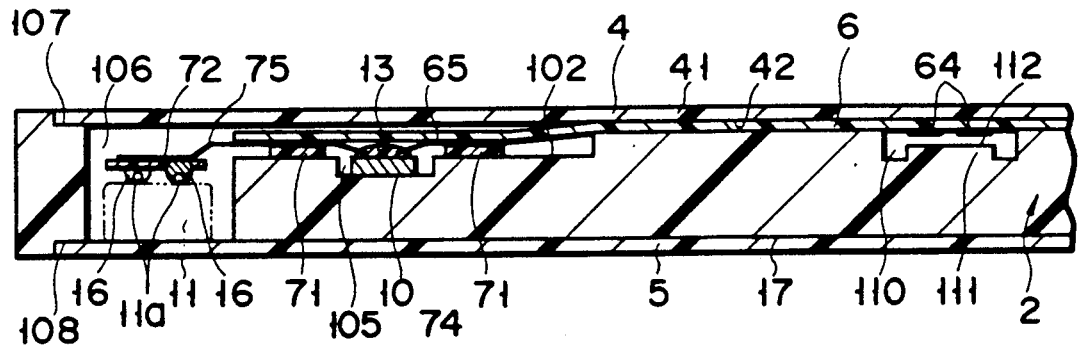

Opening 106 is formed to store second film board 72 and capacitor 11, as shown in FIG. 4, and is open to the upper and lower surfaces of lower cover 2. In this case, since film board 72 is connected to first film board 71 by only metal foil leads 75 formed of a copper foil, it can be bent at a right angle and spring back can also be prevented. Panel receiving portion 103 is provided to receive LCD panel 8, and is formed in an upper left portion of lower cover 2 to have a relatively large depth. Battery receiving portion 104 is formed to receive solar cell 9. Receiving portion 104 is formed in an upper right portion of lower cover 2, and has an inclined surface at the side of wiring board 6. Connecting portion 63 is deformed along the inclined surface, and is connected to solar cell 9. Note that pressure-sensitive hot-melt adhesive 15 is also deposited on the bottom surfaces of receiving portions 103 and 104 to form dot-like adhesive islands. Very shallow sheet receiving portions 107 and 108 are formed in upper and lower peripheral surface portions of lower cover 2, and air grooves 109 for ventilation are formed in the periphery of the upper surface.

Upper sheet 4 is formed of a transparent plastic sheet such as a polyester sheet, and adhered to the upper surface of lower cover 2. Printed layer 41 is provided on the lower surface of sheet 4, and transparent adhesive 42 (FIG. 6) is printed on the lower surface of layer 41. Printed layer 41 is printed on a portion of upper sheet 4, excluding portions facing LCD panel 8 and solar cell 9, and a non-printed portion of upper sheet 4 constitutes a transparent window portion. Key indications 43 are printed on portions of sheet 4 corresponding to movable contacts 64. Transparent adhesive 42 is printed to leave portions serving as air grooves 44 for ventilation (left portion in FIG. 6). Air grooves 44 correspond to air grooves 109 of lower cover 2 when upper sheet 4 is adhered to portion 107 of lower cover 2. With this structure, air can flow inside and outside lower cover 2 in accordance with key input operations. Lower sheet 5 adhered to the lower surface of lower cover 2 is formed of a transparent resin sheet such as a polyester sheet, and decorative printing is made on the surface of sheet 5. Sheet 5 is adhered to lower receiving portion 108 of lower cover 2 by an adhesive.

Figure 7A:
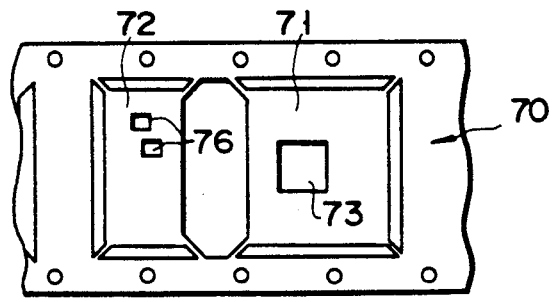
FIGS. 7A to 7D are plan views showing steps in the manufacture of a circuit board unit shown in FIG. 5, FIGS. 8A to 8D are cross-sectional views of FIGS. 7A to 7D, respectively.
Figure 8A:
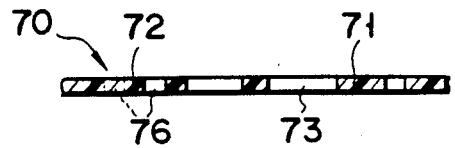
Figure 7B:
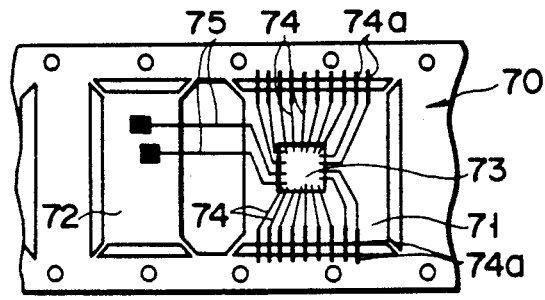
Figure 8B:
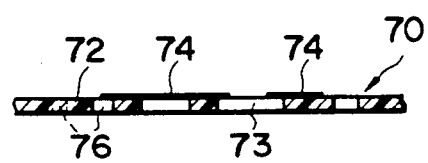

The processes in the manufacture of thin electronic calculator 1 described above will be described with reference to FIGS. 7 to 13. As shown in FIGS. 7A and 8A, tape carrier 70 which is formed of thin plastic sheet such as polyester, polymide, bismaleimide triazine, or epoxy resin containing glass fiber is punched. Square hole 73 and two through holes 76 which are utilized as film boards 71 and 72, respectively, are formed in tape carrier 70. Thereafter, a copper foil is attached to tape carrier 70 by an adhesive or the like, and is masked and etched to form metal foil lead pattern 74, as shown in FIGS. 7B and 8B. One end of each of two metal foil leads 75 extends into square hole 73 of first film board 71, and the other end thereof extends toward through hole 76 of the second film board 72, covering the hole 76. One-end portions of metal foil leads 74 extend into hole 73 of first film board 71, and the other-end portions radially extend toward the outer periphery to have a larger widthwise pitch than the one-end portions.

Figure 7C:
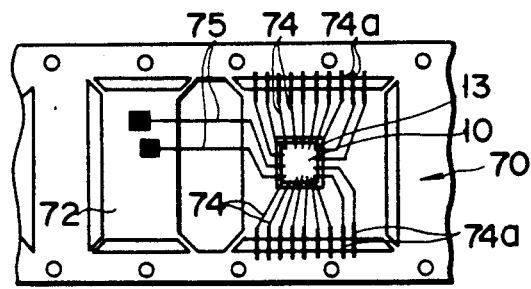
Figure 8C:
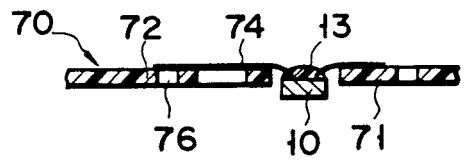
Figure 9:
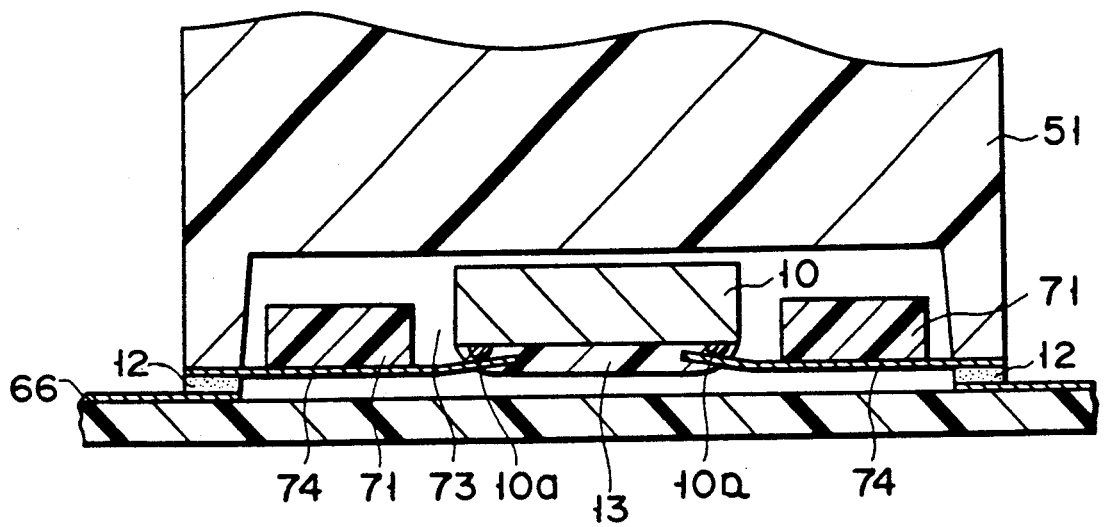

After metal foil leads 74 are formed, tin or solder plating is made on metal foil leads 74, and IC pellet 10 is arranged in hole 73 of first film board 71 from below, as shown in FIGS. 7C and 8C. Then, bump electrodes 10a (FIG. 9 illustrates gold bumps) are connected to the metal leads 74 extending inside hole 73 by thermocompression bonding. The bonding portion is coated by dripping synthetic resin 13. This bonding method is a known method of inner lead bonding (I.L.B.) for a tape carrier. Each bump electrode 10a is formed to have a thickness of 20 to 30 $\mu$m, and a plating layer formed on metal leads 74 has a thickness of about 1 $\mu$m, thus obtaining good connecting strength. In this case, one end of each metal foil lead 74 is more preferably designed to be deformed downward under IC pellet 10 by the weight of pellet 10. After one end of each metal foil lead 74 is pressed to be inclined downward, IC pellet 10 may be bonded thereto.

Figure 7D:
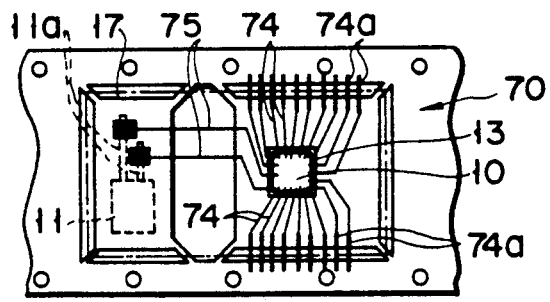
Figure 8D:
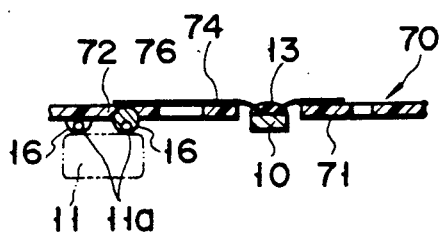

As shown in FIGS. 7D and 8D, capacitor 11 is arranged on the lower surface of second film board 72, and leads 11a of capacitor 11 are soldered at portions corresponding to through holes 76. As a result, solder 16 is filed in through holes 76, and leads 11a of the capacitor 11 and metal foil leads 75 on the upper surface side are electrically connected each other. Finally, the structure is cut along cutting line 17 as indicated by an alternate long and short dashed line in FIG. 7D. Thus, first and second film boards 71 and 72 are separated from the tape carrier.

A method of mounting circuit board unit 7 manufactured as described above on wiring board 6 will be described below.

Figure 10:
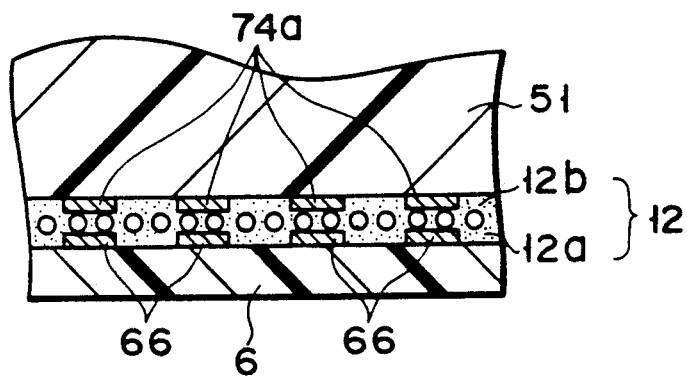

As shown in FIG. 9, wiring board 9 is turned over, and outer peripheral ends 74a of metal foil leads 74 of circuit board unit 7 are pressed against wiring board, and are mounted on connecting terminals 66 formed on the upper surface of board 6 through anisotropically electrical conductive adhesive 12. As shown in FIG. 10, adhesive 12 is a material prepared by mixing hot-melt insulating adhesive 12a with conductive particles such as nickel (Ni) particles, and is printed on connecting terminals 66 of wiring board 6. Outer peripheral ends 74a of metal foil leads 74 of circuit board unit 7 are arranged in correspondence with connecting terminals 66 of wiring board 6, and film board 72 is thermocompression-bonded from the above by jig 51. Thus, outer peripheral ends 74a of metal foil leads 74 and connecting terminals 66 are electrically conducted each other by conductive particles 12b located therebetween, as shown in FIG. 10. In this case, connecting terminals 66 formed on wiring board 6 are preferably formed to have a large width as outer peripheral ends 74a of metal foil leads 74 (see FIG. 10).

LCD panel 8 and solar cell 9 are mounted on connecting portions 62 and 63 of wiring board 6 by adhesive 12 in the same manner as described above, thus constituting electronic component assembly 3. Assembly 3 has a flat surface on the upper sheet, and is free from a problem such that solder 16 projects from through holes 76 of film board 72 thus allowing easy assembly. Since metal foil leads 74 are connected to connecting terminals 66 at outer peripheral portions 74a having a large lead width by adhesive 12, short-circuiting between foil leads 74 can be prevented, and high conductivity can be provided. More specifically, if a lead pitch is small, and the conductive particles are moved by thermocompression bonding, the leads are easily short-circuited thereby. On the contrary, if the lead pitch is too large, the number of the conductive particles located within the lead pitch is decreased. Thus, in some cases, no conductive particles may be present at all, and an electrically insulated state occurs. However, in this embodiment, such problems do not occur.

Figure 11:
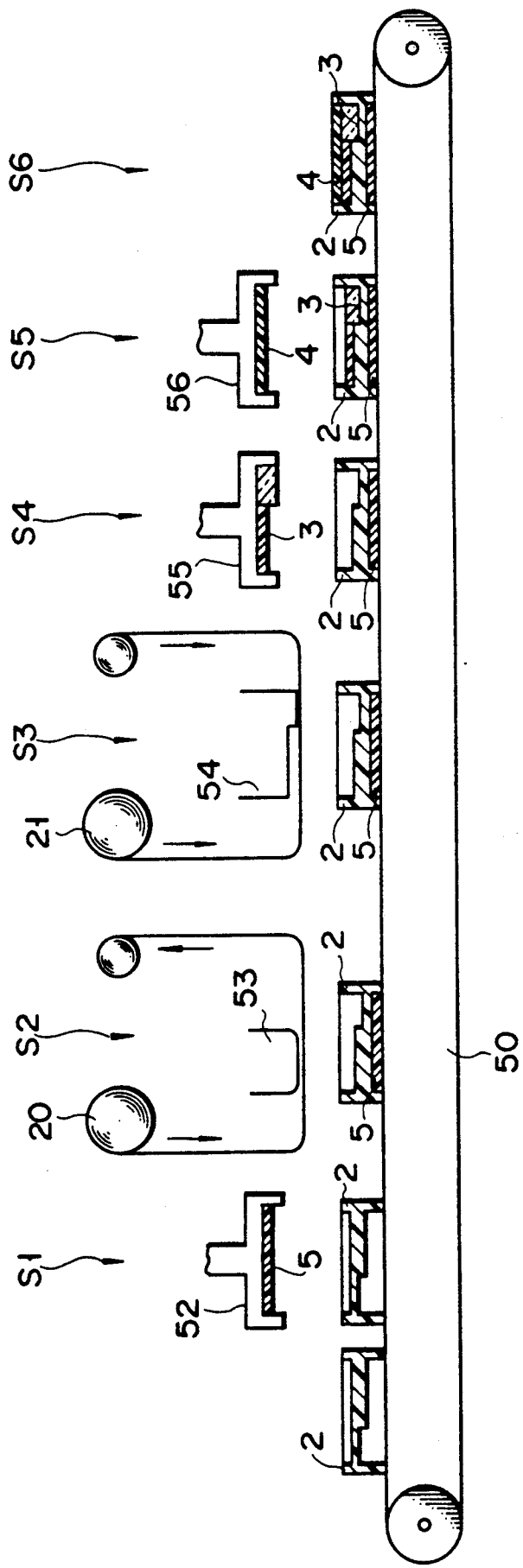

Electronic component assembly 3 is assembled in lower cover 2. FIG. 11 shows an automatic assembly line of thin electronic calculator 1. Lower cover 2 is formed beforehand into a predetermined shape by injection molding. More specifically, cover 2 is formed to have board receiving portion 101, unit receiving portion 102, panel receiving portion 103, and battery receiving portion 104 therein, and to have sheet receiving portions 107 and 108 on its upper and lower surfaces. Lower cover 2 indicated above is placed facing down on conveyor belt 50. Each lower cover 2 is conveyed by conveyor belt 50 to the right, and lower sheet 5 is adhered to sheet receiving portion 108 of lower cover 2 by vacuum head 52 in first work station S1. More specifically, lower sheet 5, on the lower surface of which adhesive 17 is printed, is chucked by vacuum head 52, and is fitted in sheet receiving portion 108 under pressure from the upper side of lower cover 2.

Figure 12:
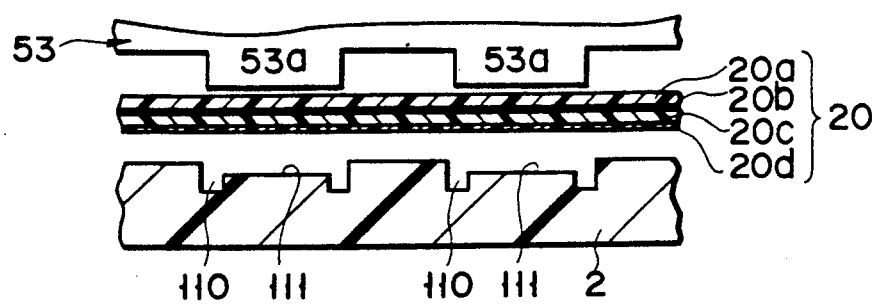

Lower cover 2 adhered with lower sheet 5 is turned over again, and is conveyed to a carbon transfer process of second work station S2. In the carbon transfer process, carbon ink 20c of carbon film 20 is transferred to board receiving portion 101 of lower cover 2 by heating jig 53, as shown in FIG. 12, thereby forming fixed contacts 112. Transfer film 20 has the following structure. That is, carbon ink 20c is printed on the lower surface of base sheet 20a through peeling agent 20b, and hot-melt adhesive 20d is attached on the surface of carbon ink 20c. Transfer film 20 is wound in a roll shape at one end side of heating jig 53, as shown in FIG. 11. Film 20 extends under the lower end of heating jig 53, and is then taken up in a roll shape at the other end side. Heating jig 53 is used for thermocompression bonding carbon transfer film 20 to board receiving portion 101 of a lower cover 2. Thermocompression bonding heads 53a are formed in the lower surface of jig 53 in correspondence with recesses 110 formed in board receiving portion 101. Each head 53a is formed to have such a diameter that is smaller than the inner diameter of each recess 110 whereas larger than the outer diameter of each projections 111. Therefore, in the carbon transfer process, when carbon transfer film 20 is heated and compressed to board receiving portion 101 of lower cover 2 by heating jig 53, compression portions, i.e., carbon ink 20c portions located between projections 111 of lower cover 2 and heads 53a of jig 53 are adhered to the upper surface of projections 111 of lower cover 2 by adhesive 20d. Every region of carbon ink 20c which was not subjected to thermocompression bonding is not peeled from base sheet 20a, and is taken up while being left on the sheet. As a result, carbon ink 20c is adhered to each projection 111 in recess 110 of board receiving portion 101, thereby forming fixed contacts 112.

Figure 13:
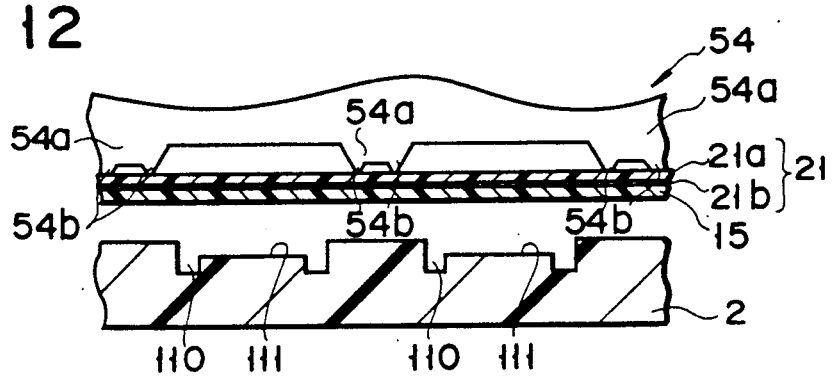

In an adhesive transfer process of third work station S3, as shown in FIG. 13, adhesive 15 of adhesive transfer film 21 is transferred to predetermined portions in lower cover 2, i.e., in board receiving portion 101, in recess 105 of unit receiving portion 102, on the bottom portion of panel receiving portion 103, and on the bottom portion of battery receiving portion 104. More specifically, adhesive transfer film 21 has the following structure. That is, pressure-sensitive hot-melt adhesive 15 is provided on the lower surface of base sheet 21a through peeling agent 21b.

Hot-melt adhesive 15 is nonvolatile type and has an adhesion property at room temperature after being melted by heating. After the adhesive is cooled to room temperature, it can provide an adhesion property and also is not hardened after adhesion. An example of such an adhesive is Type X-18 5-809 M (tradename; available from Saiden Kagaku (K.K.)). Adhesive transfer film 21 is wound beforehand in a roll shape at one end side of heating jig 54. Film 21 extends under the lower end of heating jig 54, and is taken up in a roll shape at the other end side of jig 54. In this case, jig 54 is used for heating and compressing film 21. In particular, thermocompression bonding heads 54a are formed on the lower surface of jig 54 in correspondence with board receiving portion 101 of lower cover 2 so as to cause adhesive 15 to be adhered to a portion excluding recesses 110. In addition, cutting portion 54b allowing sharp patterning of the adhesive is formed on the peripheral portion of the lower surface of each head 54a to have substantially the same height (20 to 30 μm) as the thickness of adhesive 15. Therefore, in the adhesive transfer process, when adhesive transfer film 21 is heated and compressed by jig 54, adhesive 15 is melted, and only heated portions are transferred to predetermined portions in lower cover 2. In particular, in board receiving portion 101, since adhesive 15 is cut by cutting portions 54b formed on the lower peripheries of heads 54a of jig 54, good transfer can be obtained.

In fourth work station S4, electronic component assembly 3 is chucked by vacuum head 55, and is assembled in lower cover 2. After hot-melt adhesive 15 attached in lower cover 2 is melted by jig 54 adhesive 15 still has the adhesion property at room temperature. Electronic component assembly 3 chucked by vacuum head 55 is placed at a predetermined position in lower cover 2 and is satisfactorily adhered thereto. Thereafter, lower cover 2 is conveyed to fifth work station S5, and upper sheet 4 chucked by vacuum head 56 is adhered to both the upper surfaces of cover 2 and electronic component assembly 2. Since transparent adhesive 42 (FIG. 6) is printed in advance on the lower surface of upper sheet 4, sheet 4 is pressed against and adhered to sheet receiving portion 101 on the upper surface of lower cover 2 by vacuum head 56. Thus, thin electronic calculator 1 shown in FIG. 1 is completed at sixth work station S6.

In electronic component assembly 3 used in electronic calculator 1, wiring board 6 and film board 71 having IC pellet 10 ar adhered by anisotropically electrical conductive adhesive 12. For this reason, a bonding strength is enhanced, and the calculator of the present invention can be manufactured at lower cost than a conventional electronic calculator using an IC chip. Metal foil leads 74 of film board 71 connected to connecting terminals 66 have a large lead pitch, and have wide outer peripheral ends 74a. Therefore, leads 74 and terminals 66 can be efficiently positioned, and electrical conductivity can also be improved. Since one end of each metal foil lead 74 is inclined downward from the upper surface of film board 71 into the central square hole 73, metal foil lead 74 is not in contact with the edge of IC pellet 10. As a result, a problem of shortcircuiting an internal circuit of IC pellet 10 can be eliminated. In this embodiment, square hole 65 having the same size as square hole 73 of film board 71 is formed in wiring board 6. Hole 65 is formed for synthetic resin 13 projective from IC pellet 10, and allows to decrease an inclination angle of one end of each metal foil lead 74. However, if the apparatus has a sufficient thickness, hole 65 need not be formed.

According to thin electronic calculator 1, circuit board unit 7, LCD panel 8, and solar cell 9 are connected to wiring board 6 to integrally constitute electronic component assembly 3. Electronic component assembly 3 is adhered inside lower cover 2 by pressuresensitive hot-melt adhesive 15, and upper and lower sheets 4 and 5 are adhered to the upper and lower surfaces of lower cover 2, respectively. Thus, assembly is easy, FA (factory automation) can be easily achieved, and mass-production is allowed. In this case, hot-melt adhesive 15 provided in lower cover 2 in advance before electronic component assembly 3 is received is melted by heating. However, since adhesive 15 keeps an adhesion property after it is cooled to room temperature, it can be easily cut upon transfer, and electronic components such as LCD panel 8 which cannot be subjected to thermocompression bonding can be automatically adhered inside lower cover 2.

It should be noted that when electronic component assembly 3 is adhered to lower cover 2, it must be adhered without heating wiring board 6. If wiring board 6 is heated, it is contracted and is distorted vertically in a wavy shape, thus degrading key input reliability. The upper sheet adhered to the upper surface of wiring board 6 is also distorted in a wavy shape, resulting in poor outer appearance.

In a conventional apparatus, a double-sided adhesive tape in which a cold non-drying adhesive is coated on the both surfaces of an insulating film is used. However, this is not efficient since a lower cover will be sticky and thus it takes a lot of time to correctly assemble electric components.

In this embodiment, since a transfer film having a hot-melt nonvolatile adhesive which is adhered at only compressed portions is used, the peripheral portion of the lower cover can be prevented from being adhered. Since the nonvolatile adhesive has an adhesion property at room temperature after it is transferred to the lower cover, the wiring board can be adhered to the lower cover without being heated. Thus, a problem of thermal deformation of the wiring board can be eliminated.

However, a bonding method of the wiring board and the lower case which can achieve the object of the present invention is not limited to that in the above embodiment. A second embodiment will be described hereinafter.

Second Embodiment

Figure 14:
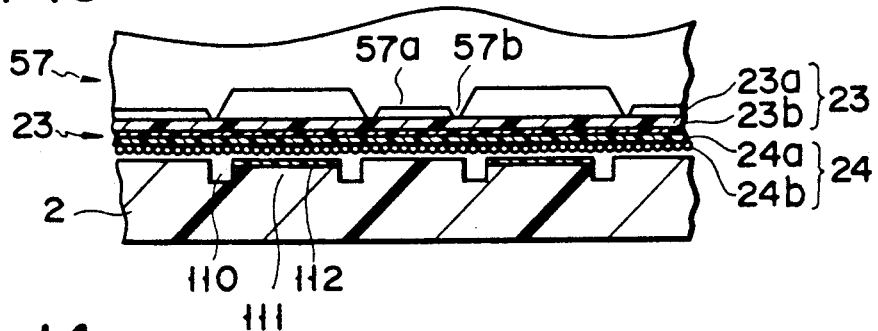
Figure 15:
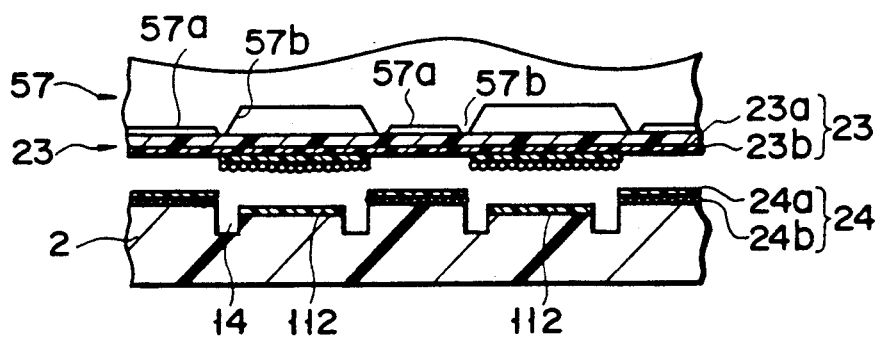
Figure 16:
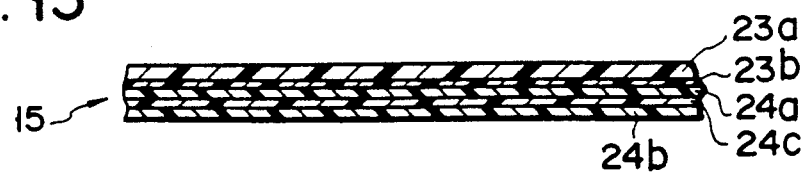

FIGS. 14 to 16 show a second embodiment.

In this embodiment, transfer sheet 23 and heating jig 57 are used in order to transfer an adhesive.

Adhesive transfer sheet 23 is elongated to have a width corresponding to that of lower cover 2, and is wound in a roll shape. As shown in FIG. 14, transfer sheet 23 comprises base sheet 23a of a nonwoven fabric, peeling agent 23b provided on the surface of base sheet 23a, and multilayered adhesive 24 attached on the surface of peeling agent 23b. Adhesive 24 comprises two adhesives layers, i.e., a layer of cold non-drying adhesive 24a which is formed on the surface of peeling agent 23b by roll-coat or printing to have a predetermined thickness, and a layer of powdery hot-melt adhesive 24b dispersed on the surface of cold adhesive 24a. In adhesive transfer sheet 23 with the above structure, one surface of cold non-drying adhesive 24a of adhesive 24 is covered by base sheet 23a, and the other surface thereof is covered by hot-melt adhesive 24b, therefore, adhesive 24a can be protected from an external influence. Heating jig 57 has a size corresponding to that of lower cover 2, and thermocompression bonding heads 57a are formed on portions of the lower surface of jig 57 corresponding to portions in lower cover 2 on which the adhesive is to be transferred, i.e , a portion of board receiving portion 101 excluding recesses 110, recess 105 of unit receiving portion 102, and the bottom surfaces of panel receiving portion 103 and battery receiving portion 104. Continuous projection 57b is formed on the peripheral portion of each head 57a. Each projection tends downward from the lower surface of jig 57 by about 20 μm to have a sharp distal end. Projection 57b is provided to allow sharp patterning of the adhesive upon thermocompression bonding. Jig 57 is heated by a heating apparatus (not shown), and is vertically moved by a lift apparatus (not shown).

A method for transferring multilayered adhesive 24 from adhesive transfer sheet 23 to lower cover 2 using heating jig 57 will be described hereinafter with reference to FIG. 11 of the first embodiment. Lower cover 2 is conveyed to third work station S3 by conveyor belt 50. Rolled transfer film 23 (transfer film 21 in FIG. 11 is replaced with 23) is fed, an is located at a position at which hot-melt adhesive 24b faces lower cover 2. As shown in FIG. 14, heating jig 57 is heated to a predetermined temperature by the heating apparatus, and is moved downward by the lift apparatus. As a result, sheet 23 is pressed downward and is bonded to the bottom surface of lower cover 2. More specifically, base sheet 23a of transfer sheet 23 is pressed downward by heads 57a formed on the lower surface of heating jig 57, and hot-melt adhesive 24b is thermocompression bonded to the bottom surface of lower cover 2 through cold adhesive 24a. Thus, hot-melt adhesive 24b of transfer sheet 23 corresponding to heads 57a of jig 57 are melted and bonded. Immediately after adhesive 24b is melted and bonded, cooling air is blown toward jig 57 from a fan (not shown), and adhesive 24b is cured on lower cover 2. Thereafter, jig 57 is moved upward by the lift apparatus, and transfer sheet 23 is pulled up from lower cover 2. As shown in FIG. 15, portions of cold adhesive 24a corresponding to heads 57a of jig 57 are peeled from base sheet 23a through peeling agent 23b in transfer sheet 23, and multilayered adhesive 24 constituted by adhesives 24b and 24a is transferred to the surface of lower cover 2. When heads 57a of jig 57 press transfer sheet 23, a downward shear force is applied to adhesives 24a and 24b through base sheet 23a of transfer sheet 23 by projections 57b formed at peripheral portions of heads 57a, so that both the adhesives can be transferred with a sharp pattern. Since hot-melt adhesive 24b is composed of an adhesive powder, a boundary between a melt portion and a non-melt portion is turn to get sharp shape.

In the method for transferring an adhesive to lower cover 2, the surface of cold adhesive 24a of transfer sheet 23 is transferred while being covered with hot-melt adhesive 24b, dusts are not attached to the surface of cold adhesive 24 before transfer, or cold adhesive 24a is not erroneously transferred to other members. Since hot-melt adhesive 24b has no adhesion property at room temperature, even if hot-melt adhesive 24b is urged against lower cover 2 at room temperature, it is not adhered to lower cover 2. This means that entire surface of adhesive 24 can be brought into uniform contact to the bottom surface of lower cover 2. Therefore, adhesive 24a is uniformly transferred to lower cover 2. Thus, before transfer, adhesive transfer sheet 23 can be easily handled, and adhesive 24a can be uniformly transferred by a simple process.

After adhesive 24a is transferred in this manner, lower cover 2 is conveyed to fourth work station S4 by conveyor belt 50, and electronic component assembly 3 is assembled in lower cover 2 by vacuum head 55, as shown in FIG. 11. Each of components of electronic component assembly 3 is pressed against cold adhesive 24a transferred to the bottom surface portions of lower cover 2, and are adhered to the bottom surface of lower cover 2. Thereafter, lower cover 2 is moved to sixth work station S6 by conveyor belt 50. Upper sheet 4 chucked by vacuum head 56 is arranged on the upper surface of lower cover 2, and is adhered thereto by adhesive 44. In this manner, the thin electronic calculator is manufactured.

In the second embodiment, the structure of a transfer sheet used for transferring an adhesive to lower cover 2 is not limited to that in the above embodiment. In any structure, it is satisfied for a hot-melt adhesive layer providing on one surface of a cold adhesive layer.

FIG. 16 shows another embodiment of an adhesive transfer sheet. In this embodiment, the multilayered adhesive described above has a three-layered structure, and separation layer 24c is interposed between cold adhesive 24a and hot-melt adhesive 24b. Separation layer 24c prevents hot-melt adhesive 24b from mixing in cold adhesive 24a. In the above embodiment, in order to adhere the electronic component assembly to the lower cover, an adhesive having characteristics of both hot-melt type and cold type is used. However, a cold adhesive having an adhesion property may be used. The embodiment will be described hereinafter.

Third Embodiment

FIGS. 17 to 20 show a third embodiment.

Figure 17:
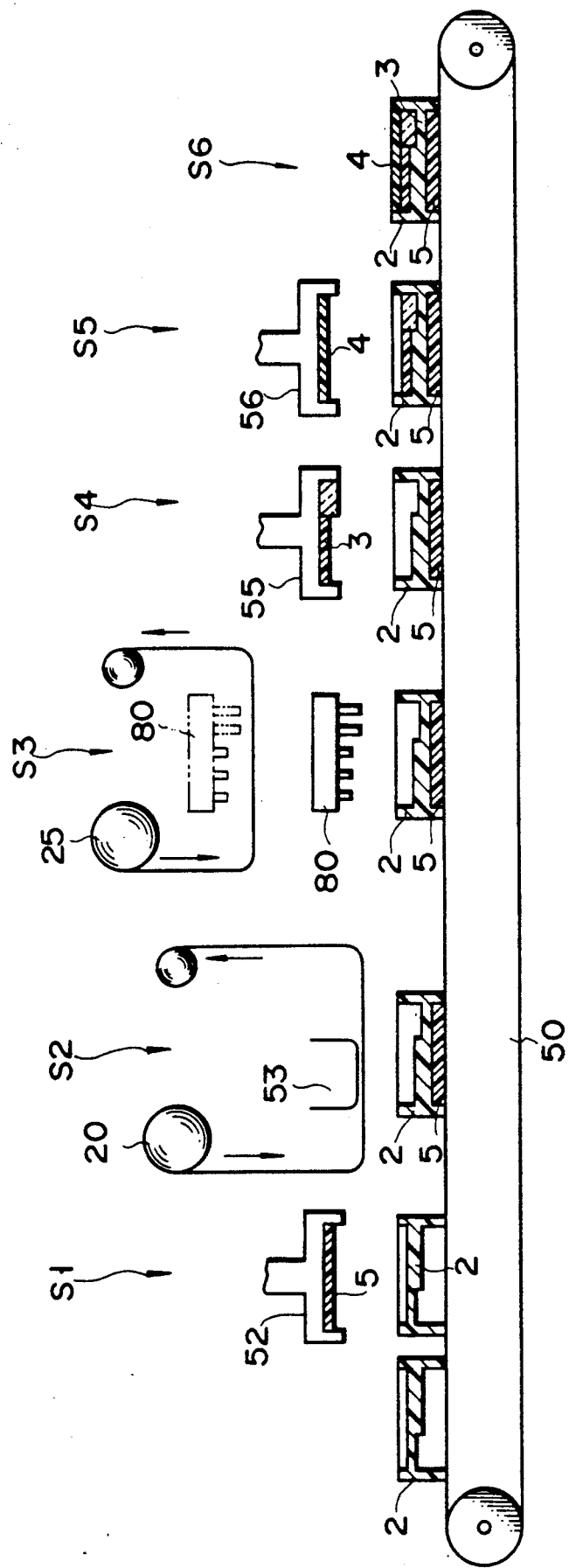
FIG. 17 is a view for explaining a manufacturing process in an automatic assembly line.

In an automatic assembly line shown in FIG. 17, electronic component assembly 3 is assembled in lower cover 2. Lower cover 2 is conveyed by conveyor belt 50 throughout the overall process.

Lower cover 2 is placed facing down on conveyor belt 50, and is conveyed thereby. The lower sheet chucked by vacuum head 52 in first work station S1 is arranged in sheet receiving portion 108 of lower cover 2, and is adhered thereto.

Then, lower cover 2 is turned over to face up, and is conveyed to work station S2. In work station S2, fixed contacts 112 are formed on board receiving portion 101 of lower cover 2. This process is the same as that at work station S2 shown in FIG. 11.

Lower cover 2 is conveyed by conveyor belt 50 to an adhesive transfer process of third work station S3, and adhesive 15 is transferred in the form of adhesive islands to board receiving portion 101, recess 105 of unit receiving portion 102, and bottom surfaces of panel receiving portion 103 and battery receiving portion 104 of lower cover 2, respectively.

The characteristic feature of the third embodiment is a transfer method of an adhesive in third work station S3. The transfer method of the adhesive will be described hereinafter in detail with reference to FIGS. 18A to 18F.

In this embodiment, in order to transfer an adhesive, adhesive transfer sheet 25 and adhesive jig 80 are used. Adhesive transfer sheet 25 has the following structure. That is, as shown in FIGS. 18A to 18C, cold type nonvolatile adhesive 26 is provided on one surface of base sheet 25a, on both surfaces of which the layers of peeling agent 25b are formed. As adhesive 26, an adhesive which is easily temporarily transferred to transfer jig 80, and is easily transferred from jig 80 to lower cover 2 is preferable. In this embodiment, an acrylic non-drying adhesive (Y-909; available from Sumitomo 3M Co.) is used.

Form of transfer pins 81 having a predetermined size and a circular distal end face corresponding to adhesive transfer portions of lower cover 2, i.e., positions corresponding to adhesive applying portions of board receiving portion 101, recess 105 of unit receiving portion 102, and the bottom surfaces of panel receiving portion 103 and battery receiving portion 104. Each transfer pin 81 is formed of, e.g., aluminum, and has head portion 81a having a larger diameter than its lower portion, as shown in FIG. 19. The lower end face (top face) of each pin 81 is utilized as a transfer surface. Synthetic resin layer 82 of a fluorine plastic (PTFE, modified fluorine type) is coated on the distal end face of each transfer pin 81 in order to satisfactorily perform temporary transfer and permanent transfer of an adhesive (acrylic adhesive), and synthetic resin layer 83 of ethylene tetrafluoride, polypropyrene hexafluoride copolymer (FEPF), or silicone (Si) is coated on the side surface of each pin 81 in order to facilitate cleaning of the adhesive (acrylic adhesive). Each transfer pin 81 treated as described above is inserted in support hole 85 of holder plate 84 of, e.g., aluminum, and is supported at its head portion 81a. Thus, each transfer pin 81 extends downward from hole 85 of holder plate 84. The extending length of each transfer pin 81 is determined depending on the height (depth) of an adhesive transfer portion of lower cover 2. For example, since the height of the bottom surface of board receiving portion 101 is different from that of panel receiving portion 103 and battery receiving portion 104, the extending lengths of transfer pins 81 are determined accordingly. Support holes 85 of holder plate 84 are respectively formed at positions corresponding to adhesive transfer portions in lower cover 2 described above, and transfer pins 81 are respectively held at support holes 85, thereby forming dot-like transfer patterns. Elastic sheet 86 is arranged on the upper portion of holder plate 84, and base plate 87 of, e.g., aluminum is arranged on the upper portion of plate 86. When holder plate 84 and base plate 87 are fastened by screws (not shown) to sandwich elastic sheet 86 therebetween, the entire structure can be integrally fixed. Elastic sheet 86 is formed of an elastic member having a good shock absorbing property such as rubber, e.g., NOSOLEX (tradename), HXB-300 (available from Iruma Rubber), or the like. By utilizing the elastic force of elastic sheet 86, transfer pins 81 inserted in holder plate 84 are efficiently pressed. Transfer jig 80 is held to be vertically movable by the drive mechanism (not shown).

A process of applying adhesive 26 inside lower cover 2 using adhesive transfer sheet 25 and transfer jig 80 will be described hereinafter. As shown in FIG. 18A, adhesive transfer sheet 25 wound around a roll is fed, and is located at a position at which the surface of adhesive 26 opposes transfer jig 80. In This case, a base plate (not shown) is arranged on the lower surface side of transfer sheet 25, which does not face jig 80. As shown in FIG. 18B, jig 80 is moved downward by the drive mechanism, and the distal end faces of transfer pins 81 are brought into contact with adhesive 26 of transfer sheet 25 on the base plate, thus performing temporary transfer. In this case, acrylic adhesive 26 can be easily transferred (adhered) to fluorine resin layer 82 coated on the distal end face of each pin 81. Since resin layer 83 having a good peeling property for the acrylic adhesive is coated on the side surface of each pin 81, a bonding force of adhesive 26 attached to the side surface of each pin 81 is very weak. A shock applied to pins 81 is absorbed by elastic sheet 86 of jig 80, and pins 81 can be stably held, so that temporary transfer to transfer pins 81 can be stabilized. After the temporary transfer, jig 80 is lifted by the drive mechanism, as shown in FIG. 18C, and transfer pins 81 are separated from transfer sheet 25.

Figure 18D:
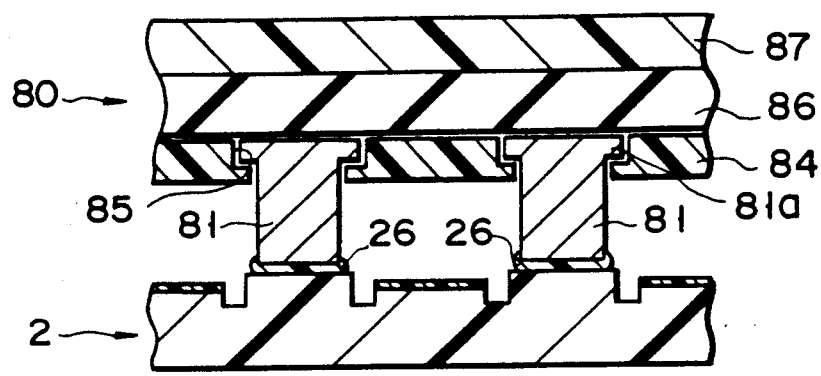
Figure 18E:
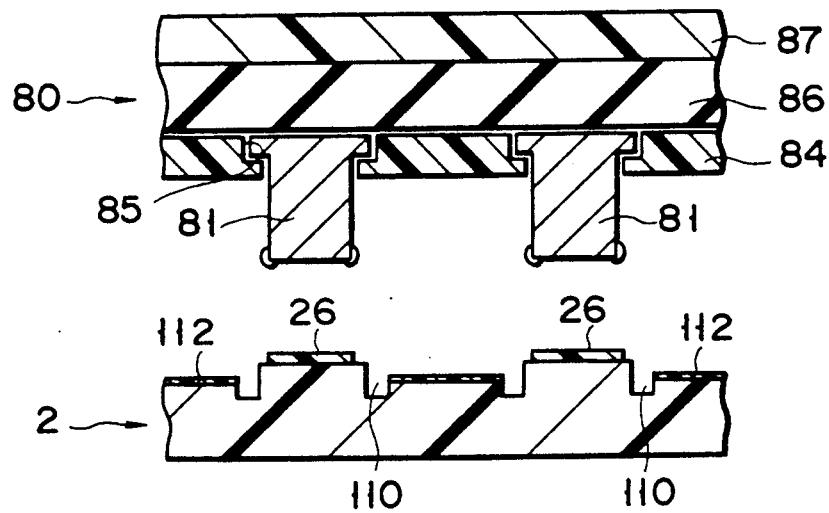

As shown in FIG. 18D, jig 80 to which adhesive 26 is adhered is moved above lower cover 2, and the distal end faces of transfer pins 81 oppose the corresponding adhesive transfer portions of lower cover 2. In this case, transfer jig 80 is moved downward, and the distal end faces of transfer pins 81 are brought into contact with the surfaces of the corresponding adhesive transfer portions of lower cover 2. Thus, adhesive 26 temporarily transferred to the distal end face of each transfer pin 81 is permanently transferred to the surface of the corresponding portion of lower cover 2. Since the bonding strength of acrylic adhesive 26 has higher coupling force to lower cover 2 than to resin layer 82 of fluorine resin coated on the distal end face of each transfer pin 81, adhesive 26 can be easily transferred from each pin 81 to the surface of the corresponding portion of lower cover 2. A variation in height of the adhesive transfer portions is absorbed by elastic sheet 86 of jig 80, and a shock acting on pins 81 is also received thereby. Thus, since transfer pins 81 can be stably held, permanent transfer to lower cover 2 can be stabilized. After transfer, jig 80 is lifted by the drive mechanism, as shown in FIG. 18E, and transfer pins 81 are separated from sheet 25. FIGS. 18D and 18E illustrate processes which permanent transfer operations are performing for adhesive transfer portions formed into recesses 110 of board receiving portion 101 of lower cover 2, respectively. As shown in FIGS. 18D and 18E, with this method, the adhesive can be simultaneously transferred to many portions on which the adhesive must be adhered. Since each of transfer pins 81 is, in advance, provided with a length depending on the heights of the adhesive transfer portions of lower cover 2, the adhesive can be applied for with an identical compression force, even through transfer portions are situated in different depths.

Figure 18F:
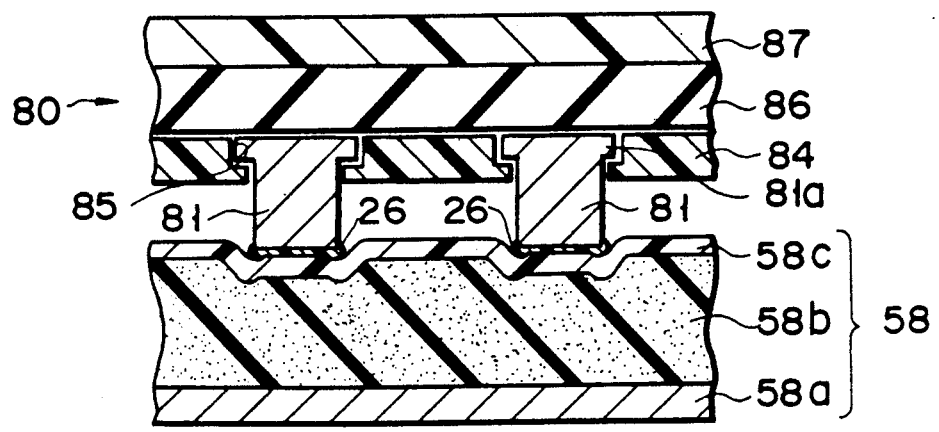

After the permanent transfer operation is completed, transfer pins 81 of jig 80 are cleaned by cleaning apparatus 58 shown in FIG. 18F. Cleaning apparatus 58 comprises base plate 58a, soft rubber 58b adhered to base plate 58a, and cleaning adhesive tape 58c adhered to the surface of soft rubber 58b. The distal end face and side surface of each transfer pin 81 are urged against adhesive tape 58c to remove the adhesive left thereon. In this case, since resin layer 83 having a high peeling property with respect to adhesive 26 is coated on the distal end face and side surface of each transfer pin 81, cleaning can be facilitated. Note that transfer pins 81 may be cleaned each time a transfer operation is performed or may be cleaned after several transfer operations are performed.

Adhesive transfer sheet 25 which was used for temporary transfer can be used again for temporary transfer, thus economically using transfer sheet 25. More specifically, in this case, in transfer sheet 25 shown in FIG. 18C, remaining portion 26A of dot portions from which adhesive 26 has already been removed is slightly moved to a position opposing transfer pins 81. As shown in FIG. 20, transfer pins 81 of transfer jig 80 are urged against adhesive 26 left on sheet 25, thus performing temporary transfer.

After most adhesive 26 of the region corresponding to jig 80 is removed as shown in FIG. 20, sheet 25 is carried slightly so that a nonused portion of adhesive transfer sheet 25 may be aligned with a position opposing transfer jig 80, and the above-mentioned temporary transfer process is repeated. With this method, transfer sheet 25 can be effectively utilized. Lower cover 2 with adhesive 26 is conveyed to fourth work station S4 shown in FIG. 17, and electronic component assembly 3 chucked by vacuum head 55 is assembled in lower cover 2 and is adhered to lower cover 2 by adhesive 26 transferred to lower cover 2. Thereafter, lower cover 2 is conveyed to fifth work station S5, and the same assembly as in the first embodiment is performed.

The characteristic feature of the third embodiment is as follows. Primarily, an adhesive is temporarily transferred to the distal end faces of transfer pin of the transfer jig. Secondarily, the adhesive temporarily transferred to the transfer pins is adhered to at least one of case members and electronic components of an electronic apparatus, and the case members and the electronic components are adhered through the adhesive This method is not limited to the above embodiment, and still another embodiment will be described hereinafter.

Fourth Embodiment

FIGS. 21 and 22 show a fourth embodiment

FIG. 21 shows the sectional structure of a thin electronic calculator. In FIG. 21, upper cover 45 is formed of a multilayered structure Metal plate 46, e.g., a stainless steel plate is formed as a key spacer on the lower surface of upper sheet 4a. Islands of adhesive 26a are formed on the lower surface of metal plate 46. Movable contacts 45a are formed on the lower surface of upper cover 45. Split fixed contacts 64a are formed on the upper surface of wiring board 6. Holes 46a are formed in metal plate 46 in correspondence with contacts 45a. In this embodiment, no fixed contacts are formed on board receiving portion 101 of lower cover 2. Metal plate 46 is provided to serve as a key spacer. Adhesive 26b for adhering metal plate 46 is formed into islands on portions which are not in contact with fixed contacts 64a and on portions which are in contact with upper cover receiving portion 107 of lower cover 2.

In the manufacturing method of this embodiment, upper cover 45 constituted by upper sheet 4a on which movable contacts 45a are printed, and metal plate 46 laminated on upper sheet 4a is prepared in advance. Transfer jig 88 to which adhesive 26a is temporarily transferred is also prepared in advance as in the third embodiment. Note that transfer pins 89 of transfer jig 88 are formed in the same lengths at predetermined positions. More specifically, since metal plate 46 is flat, all of transfer pins 81 of transfer jig 88 can have a uniform length. As shown in FIG. 22A, adhesive 26a temporarily transferred to each pin 89 of transfer jig 88 is transferred to the corresponding adhesive transfer portion (indicated by broken line) of the lower surface of metal plate 46 of upper cover 45. As shown in FIG. 22B, adhesive 26 is transferred to each adhesive transfer portion of lower cover 2. In this case, adhesive 26 is also transferred to upper cover receiving portion 107 of lower cover 2. This transfer process is the same as that described in the embodiment shown in FIGS. 18A to 18E. Thereafter, electronic component assembly 3 is arranged in lower cover 2, as shown in FIG. 22C, and is adhered thereto by adhesive 26. Furthermore, upper cover 45 is adhered on lower cover 2. More specifically, adhesive 26a transferred to the lower surface of metal plate 46 is adhered to wiring board 6, and the peripheral portion of metal plate 46 is adhered through adhesive 26 to the upper cover receiving portion 107 of lower cover 2. In this case, an insulating agent is applied to metal plate 46 so as to prevent short-circuiting between metal plate 4 and electronic components.

Figure 23:
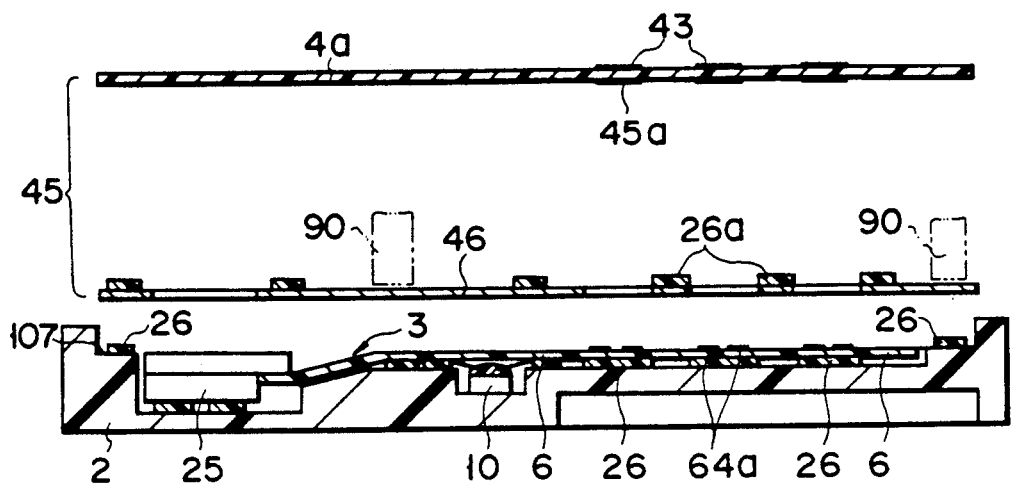

FIG. 23 shows another manufacturing method of a calculator having the structure shown in FIG. 21. In this method, adhesive 26a is selectively transferred to portions of the upper surface of metal plate 46 which do not correspond to fixed contacts 64a of wiring board 6 as a subassembly. Adhesive 26 is transferred to lower cover 2 as a main assembly. In this case, adhesive 26 is also transferred to upper cover receiving portion 107 of lower cover 2. Electronic component assembly 3 is arranged in lower cover 2, and is adhered thereto by adhesive 26. Metal plate 46 is placed on the upper portion of lower cover 2, and only the peripheral portion of metal plate 46 is adhered to upper cover receiving portion 107 of lower cover 2 through adhesive 26. Upper sheet 4a is placed on the upper surface of metal plate 46, and is adhered thereto by adhesive 26a transferred to the upper surface of metal plate 46. In this embodiment, upper cover 45 is not prepared in advance but is assembled at the assembly processes of the apparatus.

Note that the process for transferring an adhesive to metal plate 46 can be a main assembly. More specifically, after metal plate 46 is adhered to lower cover 2, a process of transferring adhesive 46a on the upper surface of metal plate 46 may be added. In the above embodiment, there is a possibility of peeling of electronic component assembly 3 from lower cover 2, when adhesive 26a is transferred to metal plate 46. For preventing this problem metal plate 46 may be urged to lower cover 2 by press jig 90 indicated as two dashed line in FIG. 23, during transferring adhesive 26a to metal plate 46. The fourth embodiment is associated with a thin electronic calculator having key contacts on the upper cover. However, this upper cover may be constituted by only one upper sheet. This embodiment will be described hereinafter.

Fifth Embodiment

Figure 24:
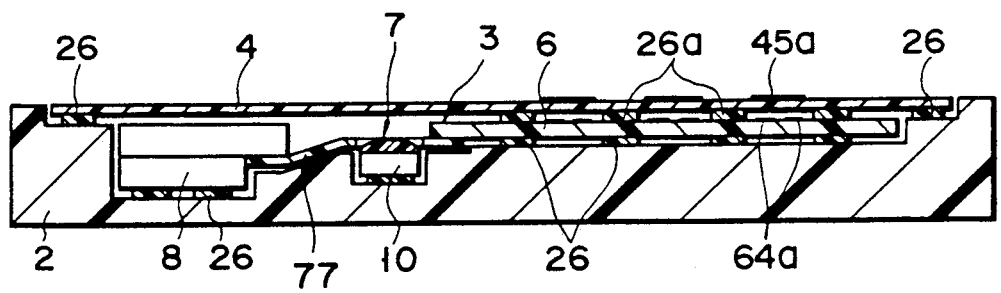
Figure 25A:
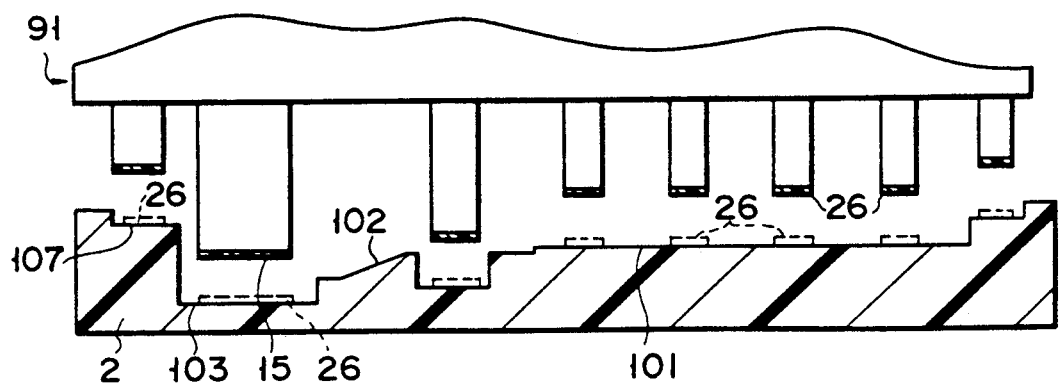

FIGS. 24 and 25 show a fifth embodiment. In this embodiment, as shown in FIG. 24, wiring board 6 is formed of a hard resin. As circuit board unit 7, flexible connector 77 is used in place of boards 71 and 72 described above, and wiring board 6 and LCD panel 8 are connected through the circuit board unit. Adhesive 26a is provided between upper sheet 4 and hard wiring board 6 excluding contact portions, thereby forming a gap therebetween. This gap is used as a key spacer. A manufacturing method of this embodiment will be described hereinafter. As shown in FIG. 25A, adhesive 26 is transferred to lower cover 2 by transfer jig 91. In this case, adhesive 26 is also transferred to sheet receiving portion 107 of lower cover 2. As shown in FIG. 25B, electronic component assembly 3 is adhered to lower cover 2 by adhesive 26. Adhesive 26a serving as a key spacer is transferred to the upper surface of hard wiring board 6 by transfer jig 92 while wiring board 6 of electronic component assembly 3 is pressed by press jig 90. Thereafter, upper sheet 4 and sheet receiving portion 107 of lower cover 2 are adhered through adhesive 26a transferred to wiring board 6.

A thin electronic calculator of the present invention may be assembled by a method wherein an adhesive is applied using a dispenser. This embodiment will be described hereinafter.

Sixth Embodiment

FIGS. 26 and 27 show a sixth embodiment.

Figure 27A:
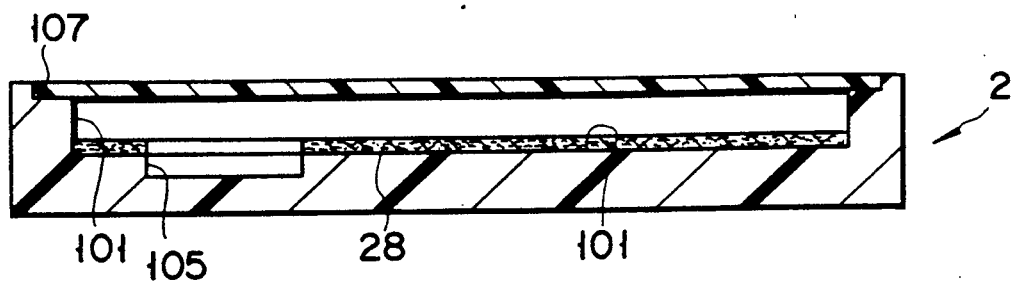
Figure 27B:
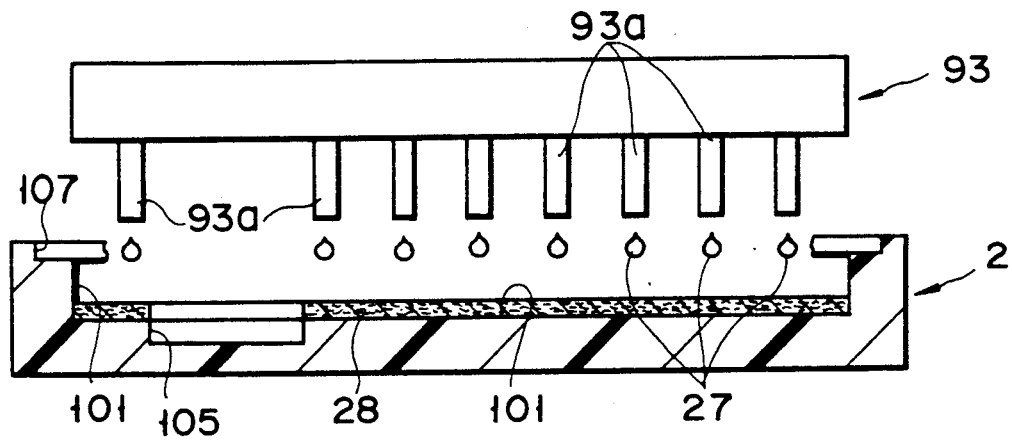
Figure 27C:
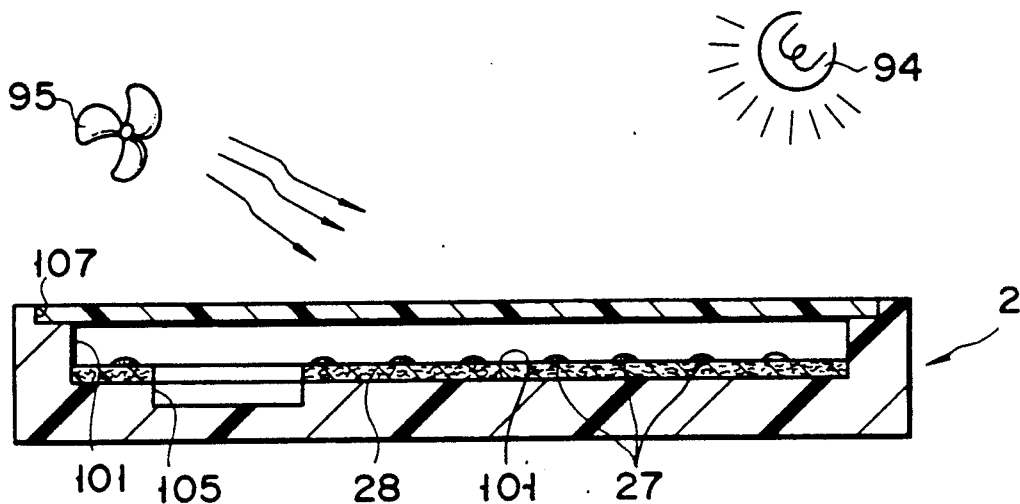

In FIG. 26, the characteristic feature of this embodiment is that electronic component assembly 3 and lower cover 2 are adhered by water-absorbing fiber sheet 28 which is impregnated with water-soluble adhesive 27 in the form of islands. Other structures are the same as those in FIG. 24, and a detailed description thereof will be omitted. As fiber sheet 28, a roughened felt material, nonwoven fabric, or the like having a structure providing a good water absorption property is normally employed. An example of water-soluble adhesive 27 is an emulsion adhesive, e.g., TB-1548 (available from Three Bond Co.). In the manufacture of this thin electronic calculator, as shown in FIG. 27A, water-absorbing fiber sheet 28 is placed in board receiving portion 102 of lower cover 2. As shown in FIG. 27B, water-soluble adhesive 27 is potted at a plurality of predetermined portions of fiber sheet 28 from potting apparatus 93. Potting apparatus 93 comprises a plurality of nozzle-like dispensers 93a arranged at predetermined intervals. Water-soluble adhesive 27 is simultaneously potted in predetermined amounts from dispensers 93a. Since fiber sheet 28 has a water absorption property, only an aqueous component contained in water-soluble adhesive 27 is impregnated in fiber sheet 28, thereby immediately increasing a bonding strength of the adhesive. As shown in FIG. 27C, fiber sheet 28 is dried by warm air. The warm air is obtained by blowing heat dissipated from infrared lamp 94 and fan 95 to the entire fiber sheet 28. Thus, the aqueous component contained in the potted adhesive is evaporated to obtain an adhesive having a bonding strength high enough to bond circuit board 6. In this case, since the aqueous component of water-soluble adhesive 27 which is potted and impregnated in a plurality of portions of fiber sheet 28 is absorbed in a wide area extending from the potted portion, it can be easily dried for a short period of time. When adhesive 27 has reached a state having a sufficient bonding strength, warm air drying is stopped, and circuit board 6 is urged against fiber sheet 28 and is adhered inside board receiving portion 101 of lower cover 2.

If a water-absorbing agent is impregnated in advance in fiber sheet 28, a drying time of water-soluble adhesive 27 is shortened.

A thin electronic calculator described below is manufactured by a method wherein an adhesive is potted from a dispenser directly to a lower cover.

Seventh Embodiment

Figure 29:
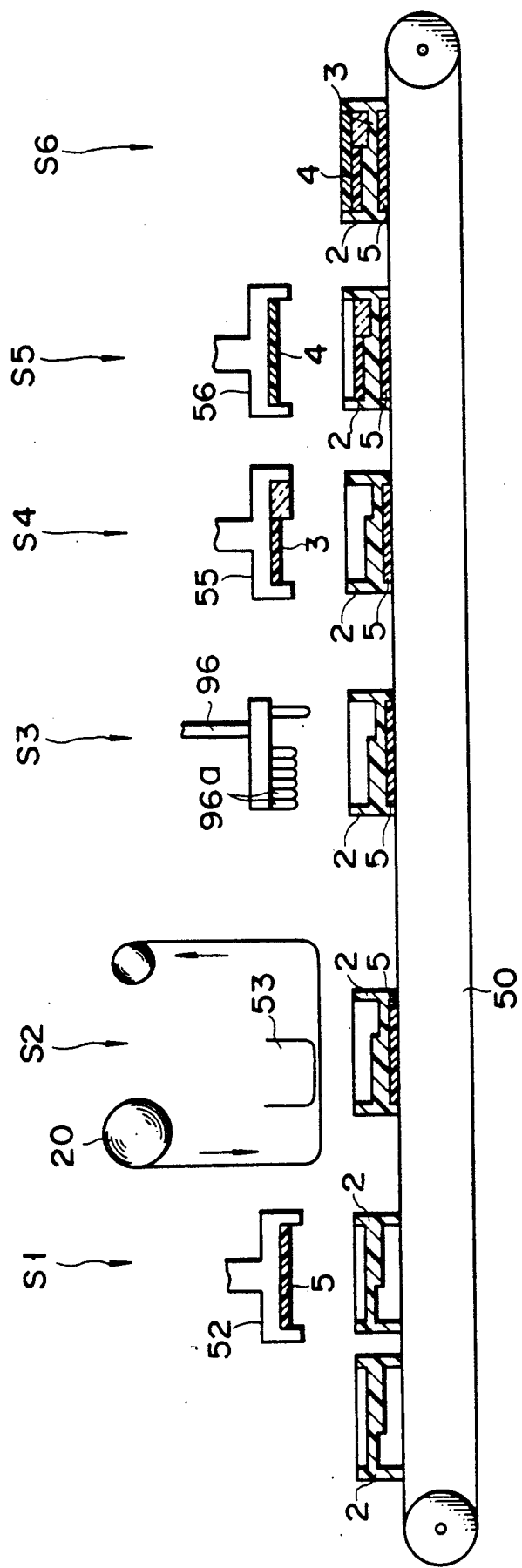

FIGS. 28 to 30 show a seventh embodiment.

As shown in FIG. 28, in this embodiment, recesses 110 in which fixed contacts 112 are formed in board receiving portion 101 of lower cover 2 as in FIG. 2.

In this embodiment, however, there are provided outer air communication grooves 116 for bridging every adhering bases 113 each other between recesses 110 of board receiving portion 101, in other words, between movable contacts 64 of a wiring board.

FIG. 30A shows in detail adhering base 113 and outer air communication groove 116. Adhering base 113 is formed into a substantially columnar shape and has upper surface 114 slightly lower than the upper surface level of board receiving portion 101, and groove 115 is formed therearound. Water-soluble adhesive (e.g., TB-1548 available from Three Bond Co.) 27 as in the fifth embodiment is potted on upper surface 114 of base 113. Adhesive 27 applied to upper surface 114 is pressed by the surface of wiring board 6 when wiring board 6 is covered to board receiving portion 101. Adhesive 27 is expanded to a layer of a thickness in accordance with a space between upper surface 114 and the surface of wiring board 6. In this case, an excess portion of the adhesive extends from upper surface 114, and is escaped into groove 115.. Therefore, adhesive 27 applied to the bases 113 is uniform in thickness on upper surfaces 114. It provides a uniform bonding strength. Primarily, wiring board 6 is adhered to the upper surface of board receiving portion 101 by an initial bonding strength of adhesive 27 when it is disposed on upper surface 114 of base 113. After the apparatus is completed, the adhesive is dried and hardened by outer air flowing through grooves 116 communicating with the exterior of the apparatus, thus, a predetermined bonding strength may be obtained. Groove 116 is slightly deeper than that of upper surface 114 of each base 113, and each of grooves 115 around bases 113 is communicated each other through grooves 116.

Bases 113, grooves 115 around bases 113, and grooves 116 are also formed in panel receiving portion 103 and battery receiving portion 104 of lower cover 2. LCD panel 8 and solar cell 9 are adhered to lower cover 2 by adhesive 27.

An automatic assembly method of a thin electronic calculator of the seventh embodiment will be described with reference to FIG. 29.

The electronic calculator is assembled in the same manner as in the embodiment shown in FIG. 11 up to second work station S2. In third work station S3, water-soluble adhesive 27 is potted on the upper surfaces of adhering bases 113 provided to predetermined positions of board receiving portion 101, panel receiving portion 103, and battery receiving portion 104 of lower cover 2, respectively. Adhesive 27 is potted from a plurality of nozzle-like dispensers 96a of potting apparatus 96. In this case, dispensers 96a are arranged in correspondence with bases 113, and the same amount of adhesive 27 is simultaneously potted from these dispensers 96a.

Lower cover 2 applied with adhesive 27 as described above is conveyed to fourth work station S4. Electronic component assembly 3 which is manufactured by another line is assembled in lower cover 2 by vacuum head 55. In this case, adhesive 27 in board receiving portion 101 is pressed by wiring board 6 of electronic component assembly 3. Adhesive 27 in panel receiving portion 103 is pressed by LCD panel 8. Furthermore, adhesive 27 in battery receiving portion 104 is pressed by solar cell 9. In this manner, wiring board 6, LCD panel 8, and solar cell 9 are adhered to the corresponding receiving portions. Thus, adhesive 27 applied to the upper surfaces of bases 113 is expanded so as to get a uniform thickness, as described above. Thereafter, lower cover 2 is conveyed to fifth and sixth work stations S5 and S6 and is assembled in the same manner as in FIG. 11.

In this embodiment, adhesive 27 applied to bases 113 of lower cover 2 is dried by outer air introduced transfer air groove 109, outer air communication grooves 116 and grooves 115 in a short period of time.

In the above embodiments, a solar cell is employed as a battery. A dry cell may be employed in place of the solar cell as will be described later. Such an embodiment will be described hereinafter.

Eighth Embodiment

FIGS. 31 to 36 show an eighth embodiment.

Thin electronic calculator 1 of this embodiment does not have a solar cell, as shown in FIG. 31. Instead, a button-like primary dry cell is received in a solar cell receiving portion. Power OFF key 43a is added to key input portion 43.

Figure 32:
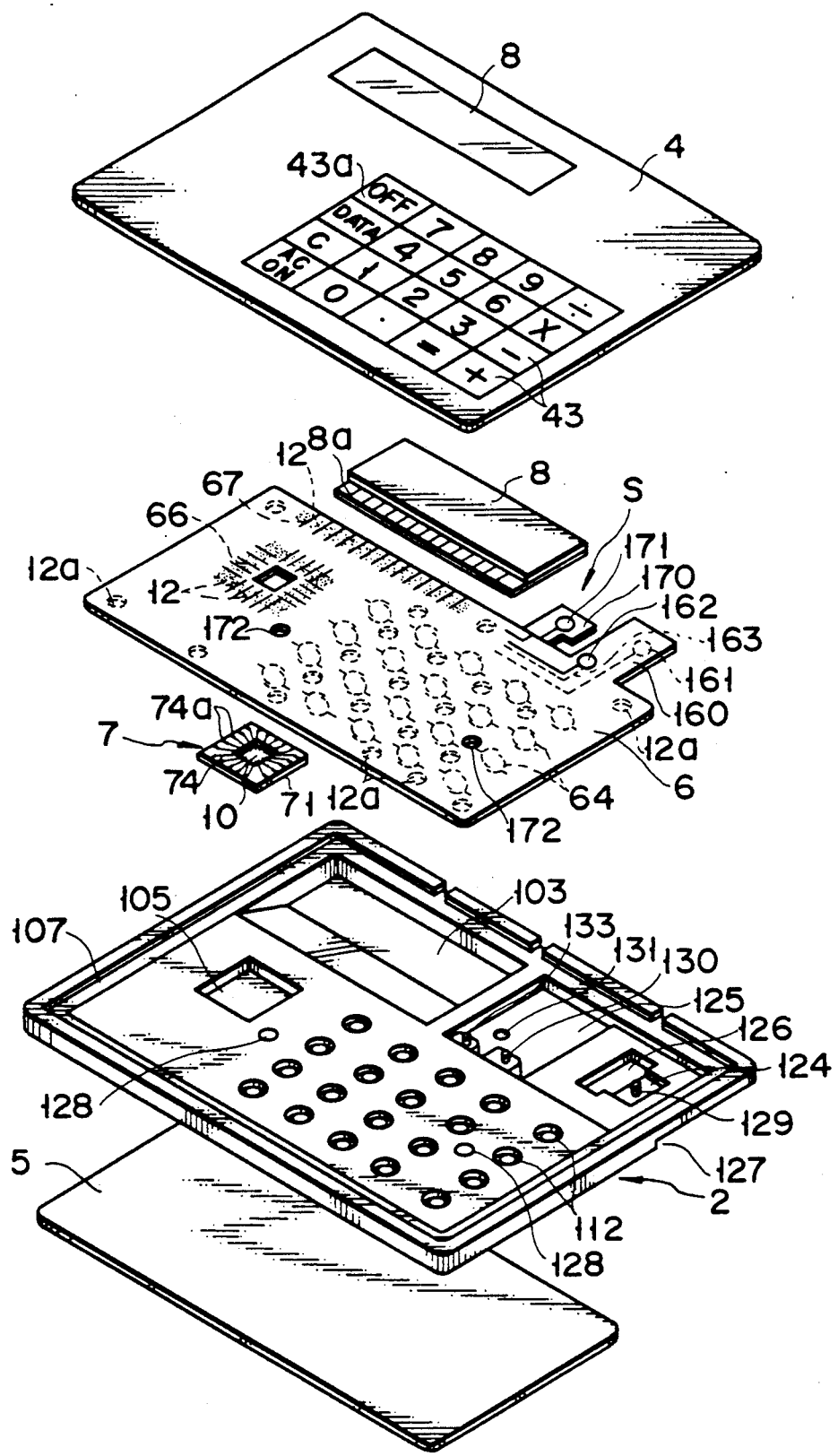
Figure 33:
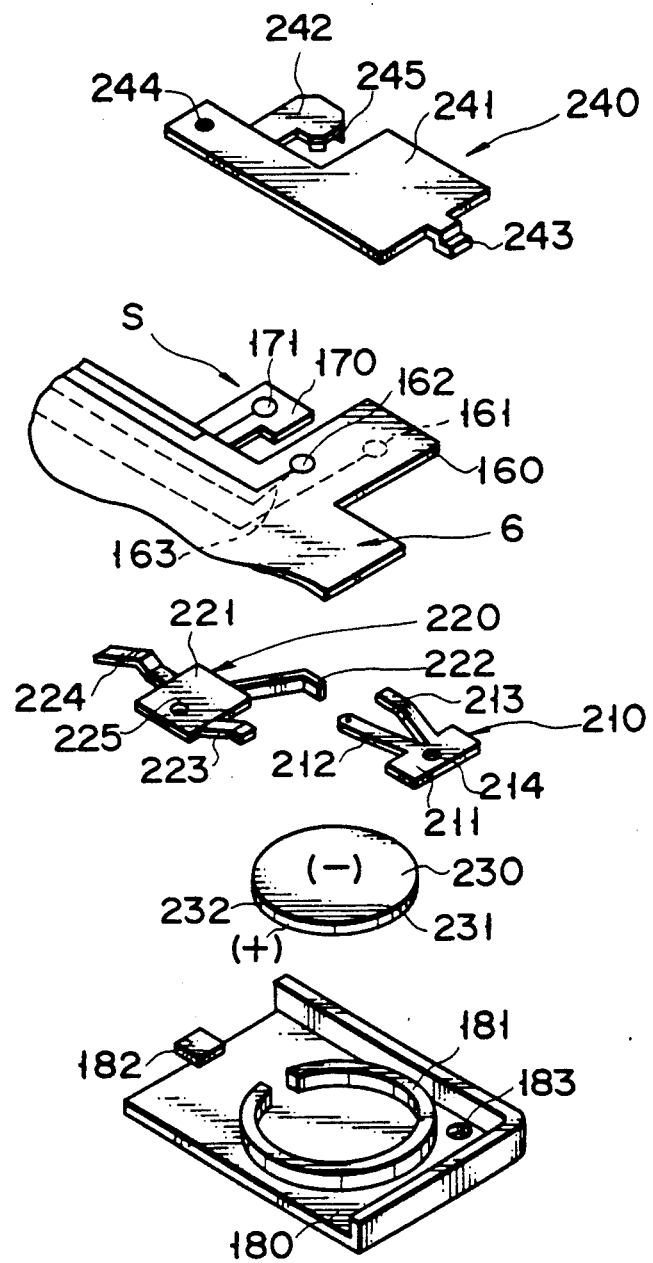

FIGS. 32 and 33 are exploded perspective views of FIG. 31, and FIG. 34 is a sectional view of FIG. 31. Thin electronic calculator 1 of this embodiment will be described in detail with reference to FIGS. 32 to 34.

As shown in FIGS. 32 and 33, receiving portions 124 and 125 for receiving battery terminal members 210 and 220, and opening 126 in which upper (negative) electrode 231 of dry cell 230 are formed in lower cover 2. Battery receiving portion 127 for receiving dry cell 230 is formed on the other side of opening 126. Positioning pin holes 128 in which two pins 97a of positioning jig 97 (to be described later) are inserted are additionally formed to lower cover 2. Jig 97 is utilized when wiring board 6 is assembled in lower cover 2. Wiring board 6 is formed by a flexible board consisting of a flexible sheet of a polyester resin, or the like. Connecting terminals 66 and 67 are formed on the lower surface of wiring board 6 at positions where electrodes 8a of LCD panel 8 and outer electrodes 74a of circuit board unit 7 are connected. Movable contacts 64 are formed at positions of wiring board 6 opposing fixed contacts 112 formed on lower cover 2. Extending portions 160 and 170 extend from the wiring board at positions corresponding to receiving portions 124 and 125 of lower cover 2. Contacts 161 and 163 are formed on the lower surface of one extending portion 160 at positions where battery terminal members 210 and 220 formed of a conductive metal are connected. As shown in FIG. 34, contact 163 is provided at a position opposing contact 162 on the upper surface of wiring board 6. Reset switch contact portion 171 constituting reset switch S together with reset segment 242 of contact plate 240 is formed on the upper surface of the other extending portion 170. Positioning pin holes 172 are formed in wiring board 6 at positions opposing positioning pin holes 128 of lower cover 2. Connecting terminals 66 and 67, movable contacts 64, and contacts 161, 162, and 163 described above are formed by a conventional etching method such that a carbon ink is printed on a metal foil of, e.g., copper, aluminum, nickel, or the like, and the metal foil is etched using the carbon ink layer as an etching resist. Anisotropically electrical conductive adhesive 12 is printed on connecting terminals 66 and 67 on the lower surface of wiring board 6 in the same manner as in the first embodiment. However, in this embodiment, anisotropically electrical conductive adhesive 12a is also printed between movable contacts 64 of wiring board 6. As will be described later, adhesive 12a printed on portions other than connecting terminals 66 and 67 is utilized to bond wiring board 6 to lower cover 2.

As a power supply of this thin electronic calculator, a primary cell is used in place of a solar cell, and IC pellet 10 can comprise a power supply circuit section. Therefore, circuit board unit 7 bonded to wiring board 6 of this embodiment can be arranged in single film board 71.

As shown in FIG. 33, on one hand, battery terminal member 210 has two arms 212, 213, integrally projected from base portion 211. Small hole 214 formed in base portion 211 receives projection 129 projected from receiving portion 124 of lower cover 2, thereby mounting member 210 to lower cover 2. In this state, arm 212 is arranged to contact upper (negative) electrode 231 of dry cell 230 received in battery receiving portion 127 from the below. On the other hand, arm 213 is arranged to be in contact with contact 161 formed on the lower surface of extending portion 160 of wiring board 6 (FIG. 34).

As shown in FIG. 33, battery terminal member 220 has three arms 222, 223, and 224 integrally projected from base portion 221. Small hole 225 formed in base portion 221 receives projection 130 projecting from receiving portion 125 of lower cover 2, thereby mounting member 220 to lower cover 2.

Arm 222 of battery terminal member 220 is in contact with peripheral (positive) electrode 232 of dry cell 230, and arm 223 is in contact with contact 163 formed on the lower surface of extending portion 160 (FIG. 34). Arm 224 extends immediately below extending portion 170 of wiring board 6, on the upper surface of which reset switch contact portion 171 is formed. Arm 224 is elastically deformed toward wiring board 6 by reset operation pin (FIG. 35B) 98 inserted from reset hole 131 (to be described later), and hence, the lower surface of extending portion 170 of wiring board 6 is pressed.

Contact plate 240 is formed of a conductive metal, and is constituted by base portion 241, reset segment 242 integrally projected from base portion 241, and hook 243, as shown in FIG. 33. Small hole 244 formed in base portion 241 and screw hole 133 formed in receiving portion 125 of lower cover 2 are fixed by a screw in a state wherein hook 243 is engaged with engaging recess portion 132 formed in lower cover 2 (FIG. 34). Thus, contact plate 240 is mounted on lower cover 2.

Contact plate 240 mounted as described above is disposed such that the lower surface of base portion 241 can be in contact with reset contact 163 formed on extending portion 160 of wiring board 6, and reset contact 242 is located immediately below contact 224 of battery terminal member 220 to interpose extending portion 170 of wiring board 6 between itself and contact 224.

A plurality of projections 245 are formed on the peripheral portion of reset contact 242 and at positions at which they do not oppose reset switch contact portion 171. Projections 245 project toward extending portion 170 of wiring board 6 and surround reset switch contact portion 171. Projections 245 maintain a predetermined interval between reset switch contact portion 171 on the upper surface of extending portion 170 of wiring board 6 and reset segment 242 of contact plate 240 so as to prevent switch contact portion 171 and segment 242 from contacting. As shown in FIGS. 34 and 35, pin 98 is inserted from reset hole 131 formed in the bottom surface portion of receiving portion 125 of lower cover 2 and lower sheet 5, and the rear surface of reset switch contact portion 171 of wiring board 6, i.e., the lower surface of extending portion 170 is pressed toward contact plate 240 through contact 224 of battery terminal member 220. Extending portion 170 of wiring board 6 is then flexed from projections 245 of reset segment 242 toward reset segment 242 of contact plate 240, and contact portion 171 of wiring board 6 is brought into contact with reset segment 242 of contact plate 240. As a result, contact portion 171 is connected to reset contact 163 on the upper surface of extending portion 160 of wiring board 6 through contact plate 240, and the reset switch is turned on, thereby inputting a reset signal.

Reference numeral 180 in FIG. 33 denotes a battery lid for closing battery receiving portion 127 of lower cover 2 from below. Annular projection 181 for receiving dry cell 230 is formed on the inner surface of the battery lid, hook 182 engaged with lower cover 2 is formed on its one end portion, and small hole 183 for fixing battery lid 180 to lower cover 2 using a screw is formed in its other end portion.

An assembly process of the thin electronic calculator with the above structure will be described hereinafter.

As shown in FIG. 32, hot-melt anisotropically electrical conductive adhesive 12 is printed in advance on the lower surface of wiring board 6 at positions on connecting terminals 67 and 66 which are electrically connected to electrodes 8a and 74a. Hot-melt anisotropically electrical conductive adhesive 12a for adhering lower cover 2 is printed in advance at given intervals excluding positions opposing movable contacts 64. These adhesives are printed in a single process.

Electrodes 8a of LCD panel 8 and peripheral electrodes 74 of circuit board unit 7 are bonded to connecting terminals 66 and 67 of wiring board 6 by adhesives 12 and 12a. In this method, adhesives 12 and 12a on the upper surface of wiring board 6 are heated and melted by a thermocompression bonding jig (not shown).

Wiring board 6 connected to LCD panel 8 and circuit board unit 7 is placed at a predetermined position on lower cover 2 placed on positioning jig 97, as shown in FIG. 36. Note that lower cover 2 and wiring board 6 are brought to the aforementioned positions, since pins 97a of positioning jig 97 are inserted in pin holes 128 and 172, respectively.

In this state, LCD panel 8 and circuit board unit 7 are received in panel receiving portion 103 and recess 105 of lower cover 2, respectively.

As shown in FIG. 37, the upper surface of wiring board 6 is pressed by heads 99a of thermocompression bonding jig 99, and adhesive 12a is heated on lower cover 2. Wiring board 6 is thus bonded to lower cover 2 by adhesive 12a.

As described above, lower cover 2 integrated with wiring board 6 is detached from positioning jig 97.

Small hole 214 of battery terminal member 210 and projection 129 of lower cover 2 are engaged with each other, so that battery terminal members 210 and 220 are respectively received in receiving portions 124 and 125 of lower cover 2 below extending portions 160 and 170 of wiring board 6. In this state, hook 243 of contact plate 240 is engaged with engaging recess portion 132 of lower cover 2, and small hole 244 of contact plate 240 is fixed to screw hole 133 of lower cover 2 using a screw. In this manner, contact plate 240 is mounted on lower cover 2. In this case, segment 213 of battery terminal member 210 is brought into contact with contact 161 of wiring board 6. Segment 223 of battery terminal member 220 is brought into contact with contact 163 of wiring board 6. Reset contact 162 on the upper surface of extending portion 170 of wiring board 6 is brought into contact with the lower surface of base portion 241 of contact plate 240.

Finally, upper and lower sheets 4 and 5 are adhered to sheet receiving portions 107 and 108 of lower cover 2 by a normal adhesive, thus completing the assembly.

Dry cell 230 is received in battery receiving portion 127 of lower cover 2, and is fixed inside portion 127 when portion 127 is closed by battery lid 180. In this state, arm 212 of battery terminal number 210 is brought into contact with upper electrode 230 of cell 230, and arm 213 is brought into contact with contact 161 on the lower surface of extending portion 160 of wiring board 6 by their elastic forces. Arm 222 of battery terminal 6 is brought into contact with peripheral electrode 232 of dry cell 230, and arm 223 is brought into contact with contact 163 on the lower surface of extending portion 160 of wiring board 6 by their elastic forces. Reset contact 162 which is provided on the upper surface of extending portion 160 of wiring board 6 in correspondence with contact 163 has the following functions. That is, contact 162 has both a function of a power supply contact spring for causing arm 223 of battery terminal number 220 to be in contact with contact 163 on the lower surface of extending portion 160 of wiring board 6, and a function of a reset contact spring for causing reset contact 162 on the upper surface of extending portion 160 of wiring board 6 to be in contact with the lower surface of base portion 241 of contact plate 240.

In the electronic calculator assembled as described above, data is input and processed in accordance with a depression of a display key 43 portion printed on upper sheet 4. More specifically, when display key 43 portion on upper sheet 4 is depressed, movable contact 64 of wiring board 6 located under upper sheet 4 is brought into contact with corresponding fixed contact 112 of lower cover 2. Upon this contact, power from dry cell 230 is supplied through arms 222 and 223 of battery terminal member 210 and contact 163, and a signal generated inside the IC pellet is recorded as a variety of data or is calculated therein. A reset operation of the electronic calculator will be described below. When pin 98 is inserted from reset hole 131 open to the rear surface of lower cover 2, as shown in FIGS. 34 and 35B, the rear surface of reset switch contact portion 171 formed on extending portion 170 of wiring board 6 is pressed toward reset segment 242 of contact plate 240 through segment 224 of battery terminal member 220, and extending portion 170 of wiring board 6 is deformed from projections 245 of reset segment 242 of contact plate 240 toward segment 242 of plate 240, as shown in FIG. 35B. Thus, reset switch contact portion 171 of wiring board 6 is brought into contact with rest segment 242 of contact plate 240. As a result, reset switch contact portion 171 of wiring board 6 is connected to reset contact 162 on the upper surface of extending portion 160 of wiring board 6 through contact plate 240 (switch on), thereby generating a reset signal.

In the thin electronic calculator of this embodiment, in order to connect wiring board 6 to an electronic component such as LCD panel 8 or circuit board unit 7, hot-melt anisotropically electrical conductive adhesives 12 and 12a of the same type are used. Since adhesives 12 and 12a can be printed in a single process, a printing process can be simplified, and efficiency of the assembly operation can be improved. In a board on which an etching resist is applied to a metal foil of, e.g., copper, aluminum, nickel, or the like adhered to wiring board 6, and a wiring pattern is formed by etching, if a cold type adhesive is used, the side portion of the metal foil is oxidized by an aqueous component contained in the adhesive and moisture absorption characteristics of the adhesive. Such a problem can be eliminated by the use of a hot-melt adhesive.

With this embodiment, the lower surface of extending portion 170 of wiring board 6 is pressed by pin 98 inserted from reset hole 131 through segment 224 of battery terminal member 220. Since pin 98 is not in direct contact with wiring board 6, damage to wiring board 6 can be prevented.

In this embodiment, LCD panel 8 and circuit board unit 7 are first adhered to wiring board 6 by adhesives 12 and 12a, and thereafter, wiring board 6 is adhered to lower cover 2. However, LCD panel 8 and circuit board unit 7 may be connected to wiring board 6 after wiring board 6 on which adhesives 12 and 12a are printed is mounted on lower cover 2. In this case, LCD panel 8 is received in panel receiving portion 103 of lower cover 2 while electrodes 8a face up, and circuit board unit 7 is received in recess 105 of lower cover 2 while peripheral electrodes 74a face up. Wiring board 6 on the lower surface of which adhesives 12 and 12a are printed in advance is then placed on lower cover 2. Finally, wiring board 6 is heated from the above by the thermocompression bonding jig, thereby bonding wiring board 6 to lower cover 2.

In the above embodiment, adhesive 12 is printed on connecting terminals 66 of wiring board 6. However, as shown in FIG. 38, adhesive 12 may be printed on a portion of film board 71 on which the other end 74a of each metal foil lead 74 is arranged.

What is claimed is:

1. An electronic apparatus having, electronic components which are disposed in upper and lower covers comprising:
   a film board in which an opening larger than dimensions of an IC pellet is formed;
   a plurality of metal foil leads fixed on an upper surface of said film board and each having one end extending inside said opening and located at a level lower than the upper surface of said film board and the other end extending toward an outer peripheral portion of said film board and formed to have a width larger than that of the one end, the pitch of the other ends being larger than that of the one ends;
   an IC pellet having bump electrodes connected to said one ends of said metal foil leads, respectively;
   a wiring board having connecting terminals respectively opposing the other ends of said metal foil leads; and
   an anisotropically electrical conductive adhesive interposed between said film board and said wiring board to electrically connect the other ends of said metal foil leads and said connecting terminals of said wiring board and to bond said film board to said wiring board.

2. An apparatus according to claim 1, wherein said wiring board is made of a polyester sheet.

3. An apparatus according to claim 1, wherein said wiring board has a through hole in a portion opposing said IC pellet.

4. An apparatus according to claim 1, wherein said film board includes a power supply circuit.

5. An apparatus according to claim 4, wherein said film board comprises two portions respectively having said IC pellet and said power supply circuit.

6. An apparatus according to claim 5, wherein said two portions of said film board are connected to each other by metal foil leads for connecting said IC pellet and electronic components of said power supply circuit.

7. An apparatus according to claim 1, wherein said wiring board and said lower cover are adhered to each other by a plurality of adhesive islands arranged therebetween at predetermined intervals.

8. An apparatus according to claim 7, wherein said adhesive is a hot-melt type nonvolatile adhesive.

9. An apparatus according to claim 7, wherein said adhesive has a multilayered structure consisting of hot-melt type and cold-type adhesive layers.

10. An apparatus according to claim 9, wherein said hot-melt type adhesive layer is comprised of fine particles.

11. An apparatus according to claim 7, wherein said adhesive is formed of a single layer of acrylic adhesive.

12. An apparatus according to claim 7, wherein said adhesive is a water-soluble adhesive.

13. An apparatus according to claim 7, wherein said adhesive is an anisotropically electrical conductive adhesive.

14. An apparatus according to claim 7, wherein said lower cover has key input contacts on a surface opposing said wiring board.

15. An apparatus according to claim 14, wherein said lower cover has air grooves extending from an electronic component receiving portion and communicating with an external portion.

16. An apparatus according to claim 7, wherein said lower cover has adhering bases each surrounded by a groove, and said adhesive is interposed between said adhering bases and said wiring board.

17. An apparatus according to claim 16, wherein said lower cover further has outer air communication grooves for communicating the grooves formed around said adhering bases and communicating with said air grooves.

18. An apparatus according to claim 7, wherein said lower cover is adhered to said wiring board by an adhesive.

19. An apparatus according to claim 18, wherein an adhesive is coated on said upper cover.

20. An apparatus according to claim 19, wherein the adhesive coated on said upper cover has a recessed pattern, extending from a portion corresponding to an electronic component receiving portion of said lower cover to the periphery of said upper cover, for flowing air.

21. An apparatus according to claim 7, wherein said electronic component receiving portion receives a display panel connected to said wiring board by an anisotropically electrical conductive adhesive.

22. An apparatus according to claim 21, wherein said lower cover has an inclined surface which supports said film board and is inclined downward toward said display panel.

23. An apparatus according to claim 21, wherein said electronic component receiving portion receives a power supply battery connected to said wiring board.

24. An apparatus according to claim 23, wherein said power supply battery comprises a solar cell connected to said wiring board by an anisotropically electrical conductive adhesive.

25. An apparatus according to claim 23, wherein said power supply battery comprises a primary dry cell.

26. An apparatus according to claim 7, wherein said wiring board is formed of a flexible member.

27. An apparatus according to claim 26, wherein said wiring board has two contacts, and a projection corresponding to a portion around one of said contacts is formed in said electronic component receiving portion and a conductive member contacting the other one of said contacts is received in said electronic component receiving portion.

28. An electronic apparatus comprising:
circuit board unit having:
an IC pellet having a plurality of electrodes, a film board in which an opening larger than dimensions of said IC pellet is formed, a plurality of metal foil leads fixed to said film board and each having one end extending inside said opening and the other end extending toward an outer periphery of said film board, and a plurality of bump electrodes for respectively connecting said electrodes of said IC pellet to the one ends of said metal foil leads,
a wiring board having key contacts;
anisotropically electrical conductive adhesive for bonding said circuit board unit means to said wiring board;
lower cover means for receiving said circuit board unit and said wiring board means;
a plurality of adhesive islands means provided for bonding said wiring board to said lower cover means and separated from each other;
an upper cover having key indications opposing said key contacts of said wiring board; and
adhering means for connecting said wiring board and said upper cover.

* * * * *